(12) United States Patent
Ahn

(10) Patent No.: US 7,439,088 B2
(45) Date of Patent: Oct. 21, 2008

(54) LIQUID CRYSTAL DISPLAY DEVICE AND FABRICATING METHOD THEREOF

(75) Inventor: Jae-Jun Ahn, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 312 days.

(21) Appl. No.: 11/132,071

(22) Filed: May 18, 2005

(65) Prior Publication Data

US 2005/0260780 A1 Nov. 24, 2005

(30) Foreign Application Priority Data

May 18, 2004 (KR) ............... 10-2004-0035338

(51) Int. Cl.
*H01L 21/00* (2006.01)
(52) U.S. Cl. .............. 438/30; 438/149; 438/150; 438/151; 438/154; 257/E21.412; 257/E21.316
(58) Field of Classification Search ............ 438/30, 438/149–154; 257/E21.412, E21.316, E27.111
See application file for complete search history.

(56) References Cited

U.S. PATENT DOCUMENTS

| | | |
|---|---|---|
| 5,598,285 A | 1/1997 | Kondo et al. |
| 5,838,037 A | 11/1998 | Masutani et al. |
| 5,946,060 A | 8/1999 | Nishiki et al. |
| 5,990,987 A | 11/1999 | Tanaka |
| 6,028,653 A | 2/2000 | Nishida |
| 6,097,454 A | 8/2000 | Zhang et al. |
| 6,266,166 B1 | 7/2001 | Katsumata et al. |
| 6,288,763 B1 | 9/2001 | Hirota |
| 6,297,866 B1 | 10/2001 | Seo et al. |
| 6,356,318 B1 * | 3/2002 | Kawahata ................ 349/38 |
| 2002/0117691 A1 * | 8/2002 | Choi et al. ............... 257/225 |
| 2003/0107037 A1 * | 6/2003 | Youn et al. .............. 257/59 |
| 2004/0095544 A1 * | 5/2004 | Chang et al. ............ 349/152 |
| 2004/0207792 A1 * | 10/2004 | Wu .......................... 349/141 |
| 2005/0213013 A1 * | 9/2005 | Chen et al. .............. 349/141 |

FOREIGN PATENT DOCUMENTS

JP 2001-154636 6/2001

* cited by examiner

*Primary Examiner*—Walter Lindsay, Jr.
*Assistant Examiner*—Abdulfattah Mustapha
(74) *Attorney, Agent, or Firm*—Brinks Hofer Gilson & Lione

(57) ABSTRACT

An array substrate for a liquid crystal display device includes a substrate, a gate line and a data line crossing each other to define a pixel region, a thin film transistor at a crossing of the gate and data lines, a metal pattern over the gate line, a passivation layer exposing the substrate in the pixel region, a part of the thin film transistor and a part of the metal pattern, and a pixel electrode in the pixel region. The pixel electrode is connected to the part of the thin film transistor and contacts the part of the metal pattern. The metal pattern has at least one curved portion in a side contacting the pixel electrode.

18 Claims, 32 Drawing Sheets

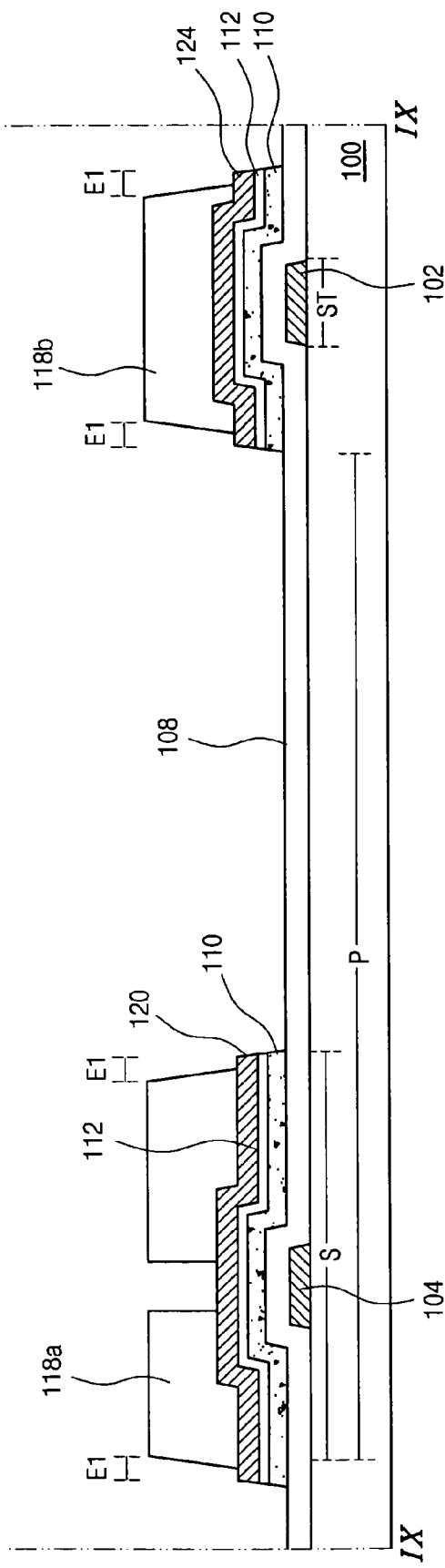
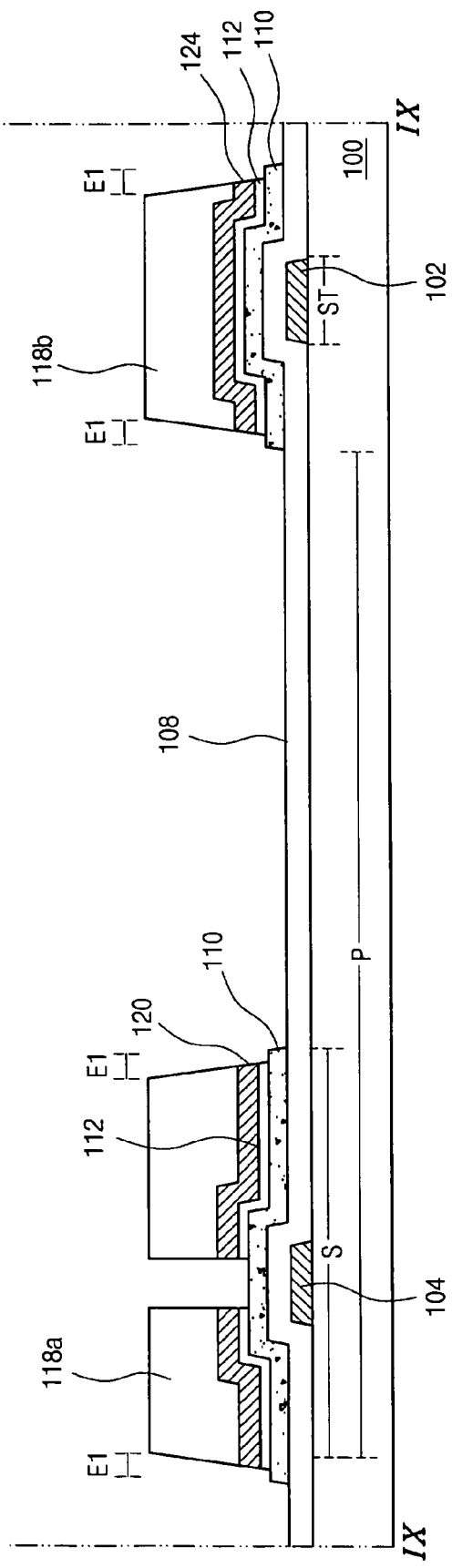
FIG. 11D
FIG. 11E

LIQUID CRYSTAL DISPLAY DEVICE AND FABRICATING METHOD THEREOF

This application claims the benefit of the Korean Patent Application No. 2004-035338 filed on May 18, 2004, which is hereby incorporated by reference for all purposes as if fully set forth herein.

FIELD OF THE INVENTION

The present invention relates to a liquid crystal display (LCD) device and more particularly, to an array substrate for the liquid crystal display device fabricated through three-mask processes and a method of manufacturing the same.

DISCUSSION OF THE RELATED ART

FIG. 1 is an exploded perspective view illustrating a related art liquid crystal display (LCD) device. The related art LCD device 9 has upper and lower substrates 20 and 10, which are spaced apart from and facing each other, and also has liquid crystal 18 interposed between the upper substrate 20 and the lower substrate 10.

The upper substrate 20 includes a black matrix 22, a color filter layer 24, and a common electrode 28 subsequently on the inside (i.e., the side facing the lower substrate 10). The black matrix 22 has openings. The color filter layer 24 corresponds to the openings in the black matrix 22 and includes three color filters of red (R), green (G), and blue (B). The common electrode 28 is formed on the color filter layer 24 and is transparent.

At least one gate line 12 and at least one data line 14 are formed on the inner surface of the lower substrate 10 (i.e., the side facing the upper substrate 20). The gate line 12 and the data line 14 cross each other to define a pixel region P. A thin film transistor T, as a switching element, is formed at the crossing of the gate line 12 and the data line 14. The thin film transistor T includes a gate electrode, a source electrode and a drain electrode. A plurality of such thin film transistors is arranged in a matrix form to correspond to other crossings of gate and data lines. A pixel electrode 16, which is connected to the thin film transistor T, is formed in the pixel region P. The pixel electrode 16 corresponds to the color filter, and is formed of a transparent conductive material such as indium-tin-oxide (ITO) that transmits light relatively well. The lower substrate 10, which includes the thin film transistors T and the pixel electrodes 16 arranged in the matrix form, may be commonly referred to as an array substrate.

In operation, a scanning pulse is applied to the gate electrode of the thin film transistor T through the gate line 12 and a data signal is applied to the source electrode of the thin film transistor T through the data line 14.

The LCD device 11 is driven due to electro-optical effects of the liquid crystal 18. The liquid crystal 18 is dielectric anisotropic material having a property of spontaneous polarization. When a voltage is applied, the liquid crystal 18 forms a dipole by the spontaneous polarization, and thus molecules of the liquid crystal are arranged by an electric field. Optical modulation occurs from the optical properties of the liquid crystal, which vary according to the arrangement of the liquid crystal. Images of the LCD device are produced by controlling transmittance of the light due to the optical modulation.

Since the LCD device is fabricated through complicated processes, there have been trials for reducing fabricating time and costs by simplifying the processes. As one method for this, the array substrate for the LCD device has been manufactured through processes using four masks, which may be referred to as four-mask processes, from processes using five to seven masks.

FIG. 2 illustrates a plan view of an array substrate for an LCD device fabricated through four-mask processes according to the related art. In FIG. 2, a gate line 32 and a data line 54 cross each other and define a pixel region P. A thin film transistor T is formed as a switching element at the crossing of the gate and data lines 32 and 54.

The thin film transistor T includes a gate electrode 34 that is connected to the gate line 32 and receives scanning signals, a source electrode 50 that is connected to the data line 54 and receives data signals, and a drain electrode 52 that is spaced apart from the source electrode 50. The thin film transistor T further includes an active layer 38 between the gate electrode 34 and the source and drain electrodes 50 and 52. A metal pattern 56 of an island shape overlaps the gate line 32.

A pixel electrode 64 is formed in the pixel region P and is connected to the drain electrode 52. The pixel electrode 64 is extended over the gate line 32, and thus is also connected to the metal pattern 56. The gate line 32 and the metal pattern 56 function as first and second storage capacitor electrodes, respectively, and form a storage capacitor $C_{ST}$ with a gate insulating layer (not shown) disposed between the gate line 32 and the metal pattern 56.

Although not shown in the figure, an ohmic contact layer is formed between the active layer 38 and the source and drain electrodes 50 and 52. The active layer 38 is formed of intrinsic amorphous silicon, and the ohmic contact layer is formed of impurity-doped amorphous silicon. A first semiconductor pattern and a second semiconductor pattern, which include the intrinsic amorphous silicon and the impurity-doped amorphous silicon, are formed under the data line 54 and the metal pattern 56, respectively.

As stated above, the array substrate of FIG. 2 is fabricated using four masks, and manufacturing processes of the array substrate will be described hereinafter with reference to attached drawings. FIGS. 3A to 3H are cross-sectional views taken along the line III-III of FIG. 2 illustrating a method of manufacturing an array substrate according to the related art.

FIG. 3A illustrates a first mask process. In FIG. 3A, a pixel region P including a switching region S and a storage region ST are defined on a substrate 30. A gate line 32 and a gate electrode 34 are formed on the substrate 30 by depositing a metallic material and patterning the metallic material through a first photolithography process using a mask, i.e., the first mask process. The metallic material includes aluminum (Al) or an aluminum alloy. The gate line 32 is formed along a side of the pixel region P in the storage region ST, and the gate electrode 34 is formed to correspond to the switching region S.

Next, a gate insulating layer 36 is formed on the substrate 30 including the gate line 32 and the gate electrode 34 by depositing an inorganic insulating material such as silicon nitride ($SiN_x$) or silicon oxide ($SiO_2$). Subsequently, an intrinsic amorphous silicon layer 38 and an impurity-doped amorphous silicon layer 40 are deposited on the gate insulating layer 36. A metallic layer 42 is formed on the impurity-doped amorphous silicon layer 40 by depositing one or more selected from the metallic group mentioned above.

FIGS. 3B to 3F illustrate a second mask process. In FIG. 3B, a photoresist layer 46 is formed on the entire surface of the substrate 30 including the metallic layer 42 thereon by forming photoresist. The photoresist layer 46 may be a positive type, and a portion exposed to light is developed and removed. A mask M is disposed over the substrate 30 including the photoresist layer 46 thereon. The mask M includes a transmitting portion A1, a blocking portion A2 and a half transmitting portion A3 (which may be referred to as a slit portion). A part of the photoresist layer 46 corresponding to the blocking portion A2 is not exposed to light, a part of the photoresist layer 46 corresponding to the transmitting portion A1 is entirely exposed to light, and a part of the photoresist layer 46 corresponding to the half transmitting portion A3 is partially exposed to light. Here, the half transmitting portion A3 is disposed between adjacent blocking portions A2. The half transmitting portion A2 and the adjacent blocking portions A2 correspond to the switching region S, and another blocking portion A2 corresponds to the storage region ST and a part of the gate line 32. The photoresist layer 46 is exposed to light through the mask M.

In FIG. 3C, the exposed photoresist layer 46 of FIG. 3B is developed, and a first photoresist pattern 48a and a second photoresist pattern 48b are formed. The first photoresist pattern 48a corresponds to the switching region S and has different thicknesses. The second photoresist pattern 48b corresponds to the storage region ST.

The metallic layer 42, the impurity-doped amorphous silicon layer 40 and the intrinsic amorphous silicon layer 38, which are exposed by the first and second photoresist patterns 48a and 48b, are removed. Then, as shown in FIG. 3D, the patterned intrinsic amorphous silicon layer 38, the patterned impurity-doped amorphous silicon layer 40 and the patterned metallic layer 42 correspond to the switching region S and the storage region ST.

In FIG. 3E, to remove a first part of the first photoresist pattern 48a thinner than a second part of the first photoresist pattern 48b, an ashing process is performed, and thus the metallic layer 42 in a center portion of the switching region S is exposed. At this time, the second part of the first photoresist pattern 48a and the second photoresist pattern 48b are partially removed. Accordingly, thicknesses of the photoresist patterns 48a and 48b are decreased, and a peripheral portion of the metallic layer 42 is exposed.

In FIG. 3F, the exposed metallic layer 42 of FIG. 3E is etched, and the first and second photoresist patterns 48a and 48b of FIG. 3E are removed. Therefore, source and drain electrodes 50 and 52 are formed over the gate electrode 34 and spaced apart from each other. A metal pattern 56 of an island shape is formed over a part of the gate line 32 to correspond to the storage region ST. A data line 54 of FIG. 2, which is connected to the source electrode 50, is also formed.

Next, the impurity-doped amorphous silicon layer 40 exposed between the source and drain electrodes 50 and 52 is removed to expose the intrinsic amorphous silicon layer 38. The exposed intrinsic amorphous silicon layer 38 becomes a channel CH of a thin film transistor. This process may be carried out before the first and second photoresist patterns 48a and 48b of FIG. 3E are removed. The intrinsic amorphous silicon layer 38 and the impurity-doped amorphous silicon layer 40 under the source and drain electrodes 50 and 52 are referred to as an active layer and an ohmic contact layer, respectively. In the storage region ST, a storage capacitor $C_{ST}$ is formed. The gate line 32 acts as a first capacitor electrode and the metal pattern 56 serves as a second capacitor electrode.

FIG. 3G illustrates a third mask process. In FIG. 3G, a passivation layer 58 is formed on the entire surface of the substrate 30 where the source and drain electrodes 50 and 52 are formed by depositing an inorganic insulating material such as silicon nitride ($SiN_X$) or silicon oxide ($SiO_2$) or forming an organic insulating material group such as benzocyclobutene (BCB) or acrylic resin. Subsequently, the passivation layer 58 is patterned through the third mask process to form a drain contact hole 60 and a storage contact hole 62. The drain contact hole 60 exposes the drain electrode 52, and the storage contact hole 62 exposes the metal pattern 56.

FIG. 3H illustrates a fourth mask process. In FIG. 3H, a pixel electrode 64 is formed on the substrate 30 including the passivation layer 58 thereon by sequentially depositing and patterning a transparent conductive metallic oxide such as indium tin oxide (ITO) or indium zinc oxide (IZO). The pixel electrode 64 is disposed in the pixel region P and contacts both the drain electrode 52 and the metal pattern 56.

Therefore, the array substrate for the liquid crystal display device of the related art may be fabricated through four-mask processes. However, as mentioned before, since each mask process includes several steps of cleaning, coating a photoresist layer, exposing through a mask, developing the photoresist layer, and etching, there remains room to reduce the number of processes.

SUMMARY OF THE INVENTION

By way of example only, as embodied and broadly described, an array substrate for a liquid crystal display device in one aspect includes a substrate, a gate line and a data line crossing each other to define a pixel region. A thin film transistor is disposed at a crossing of the gate and data lines. A metal pattern is disposed over the gate line. A passivation layer exposes the substrate in the pixel region, a part of the thin film transistor and a part of the metal pattern. A pixel electrode is disposed in the pixel region. The pixel electrode is connected to the part of the thin film transistor and contacts the part of the metal pattern. The metal pattern has at least one curved portion in a side contacting the pixel electrode.

In another aspect of the present invention, a method of manufacturing an array substrate for a liquid crystal display device includes forming a gate line and a data line on a substrate, the gate and data lines crossing each other to define a pixel region, forming a thin film transistor at a crossing the gate and data lines, forming a metal pattern over the gate line, forming a passivation layer exposing the substrate in the pixel region, a part of the thin film transistor and a part of the metal pattern, and forming a pixel electrode in the pixel region. The pixel electrode is connected to the part of the thin film transistor and contacts the part of the metal pattern. The metal pattern has at least one curved portion in a side contacting the pixel electrode.

In another aspect of the present invention, a method of manufacturing an array substrate for a liquid crystal display device includes defining a pixel region including a switching region and a storage region on a substrate. A gate line and a gate electrode connected to the gate line are formed through a first mask process. A part of the gate line corresponds to the storage region and a part of the gate electrode corresponds to the switching region. A gate insulating layer is formed on substantially an entire surface of the substrate including the gate line and the gate electrode. First, second and third semiconductor patterns, source and drain electrodes, a data line, and a metal pattern are formed through a second mask process. The first semiconductor pattern is disposed on the gate insulating layer over the gate electrode. The source and drain electrodes are disposed on the first semiconductor pattern and are spaced apart from each other. The second semiconductor pattern extends from the first semiconductor pattern. The data line is disposed on the second semiconductor pattern. The third semiconductor pattern is disposed in the storage region. The metal pattern is disposed on the third semiconductor pattern. A passivation layer and a pixel electrode are formed through a third mask process. The passivation layer exposes the substrate in the pixel region, a part of the drain electrode and a part of the metal pattern. The pixel electrode in the pixel region contacts the part of the drain electrode and the part of the metal pattern. The metal pattern has at least one curved portion in a side contacting the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 11A to 11F and FIGS. 12A to 12F are cross-sectional views illustrating a second mask process;

DETAILED DESCRIPTION OF THE ILLUSTRATED EMBODIMENTS

Reference will now be made in detail to embodiments of the present invention, which are illustrated in the accompanying drawings.

Figure 4:
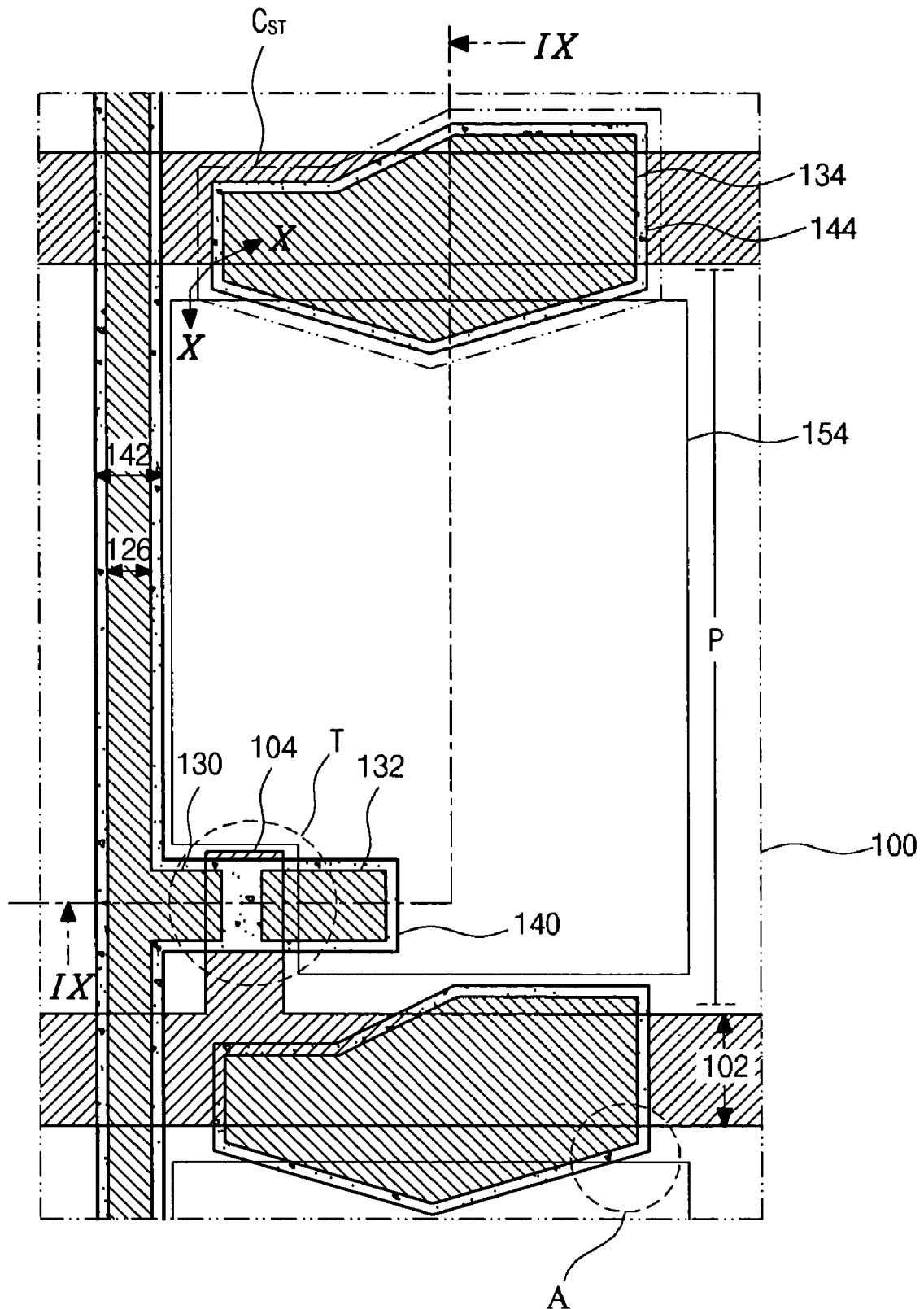
FIG. 4 is a plan view of an array substrate for a liquid crystal display (LCD) device according to an embodiment of the present invention.

FIG. 4 is a plan view of an array substrate for a liquid crystal display (LCD) device according to an embodiment of the present invention. As illustrated in FIG. 4, a gate line 102 and a data line 126 are formed on a substrate 100. The gate line 102 and the data line 126 cross each other and define a pixel region P. A thin film transistor T is formed as a switching element at a crossing portion of the gate and data lines 102 and 126.

The thin film transistor T is composed of a gate electrode 104 that is connected to the gate line 102 for receiving scanning signals, a source electrode 130 that is connected to the data line 126 for receiving data signals, and a drain electrode 132 that is spaced apart from the source electrode 130.

A metal pattern 134 of an island shape is formed over a part of the gate line 102 defining the pixel region P. The metal pattern 134 may be made of the same material as the data line 126. A pixel electrode 154 is formed in the pixel region P. The pixel electrode 154 is directly connected to the drain electrode 132 and the metal pattern 134 without contact holes.

The gate line 102 and the metal pattern 134 function as first and second storage capacitor electrodes, respectively, and form a storage capacitor $C_{ST}$ with a gate insulating layer (not shown) disposed between the gate line 102 and the metal pattern 134.

A first semiconductor pattern 140, a second semiconductor pattern 142 and a third semiconductor pattern 144 are formed under the source and drain electrodes 130 and 132, the data line 126 and the metal pattern 134, respectively. The second semiconductor pattern 142 extends from the first semiconductor pattern 140. The semiconductor patterns 140, 142 and 144 include intrinsic amorphous silicon and impurity-doped amorphous silicon. Here, peripheral portions of the first semiconductor pattern 140, the second semiconductor pattern 142 and the third semiconductor pattern 144, more particularly, peripheral portions of intrinsic amorphous silicon layers, are exposed along edges of the source and drain electrodes 130 and 132, the data line 126 and the metal pattern 134.

Although not shown in the figure, a passivation layer is formed in a region excluding the pixel electrode 154.

In the present invention, the metal pattern 134 has at least one curved portion in a side contacting the pixel electrode 154, and thus a length along sides of the metal pattern 134 between a portion overlapping the gate line 102 and a portion contacting the pixel electrode 154 is increased as compared to that in the related art. That is, a distance between the passivation layer (not shown) and the gate line 102 along the sides of the metal pattern 134 is increased. Accordingly, the gate line 102 is not exposed, even if the passivation layer and a gate insulating layer under the passivation layer may be over-etched around a region where the pixel electrode 154 contacts the metal pattern 134.

Figure 5:
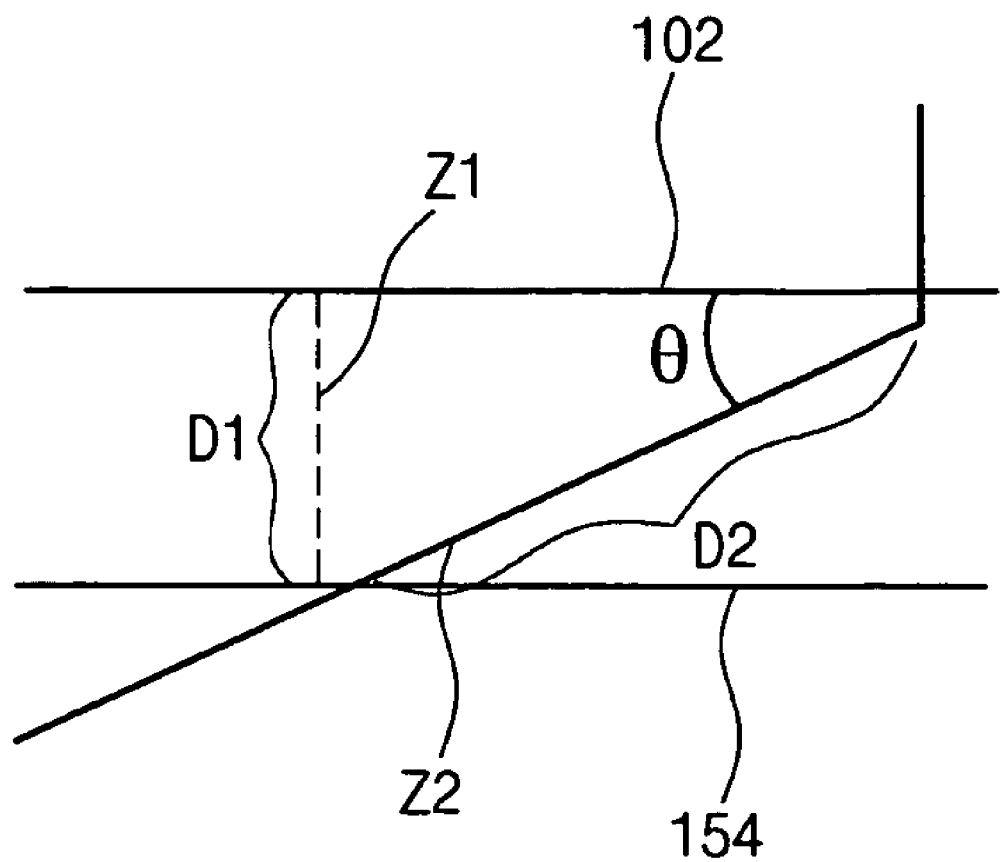
FIG. 5 is an enlarged view of the region A of FIG. 4A.

More particularly, in FIG. 5, which is an enlarged view of the region A of FIG. 4, a line Z1 perpendicular to the gate line 102 corresponds to a side of the metal pattern 134 between the gate line 102 and the pixel electrode 154 in the related art and has a length D1. On the other hand, a line Z2 inclined with respect to the gate line 102 corresponds to a side of the metal pattern 134 between the gate line 102 and the pixel electrode 154 in the present invention and has a length D2, which is longer than the length D1 of the related art. Therefore, in the present invention, a distance from a side of the passivation layer (not shown) covering the gate line 102 to a side of the gate line 102 adjacent to the side of the passivation layer along the sides of the metal pattern 134 is increased in comparison with that of the related art. In addition, although the passivation layer and the gate insulating layer may be over-etched, the gate line 102 is not exposed. Here, the length D2 increases as an angle θ between the side of the gate line 102 and the inclined side of the metal pattern 134 decreases.

Figure 6:
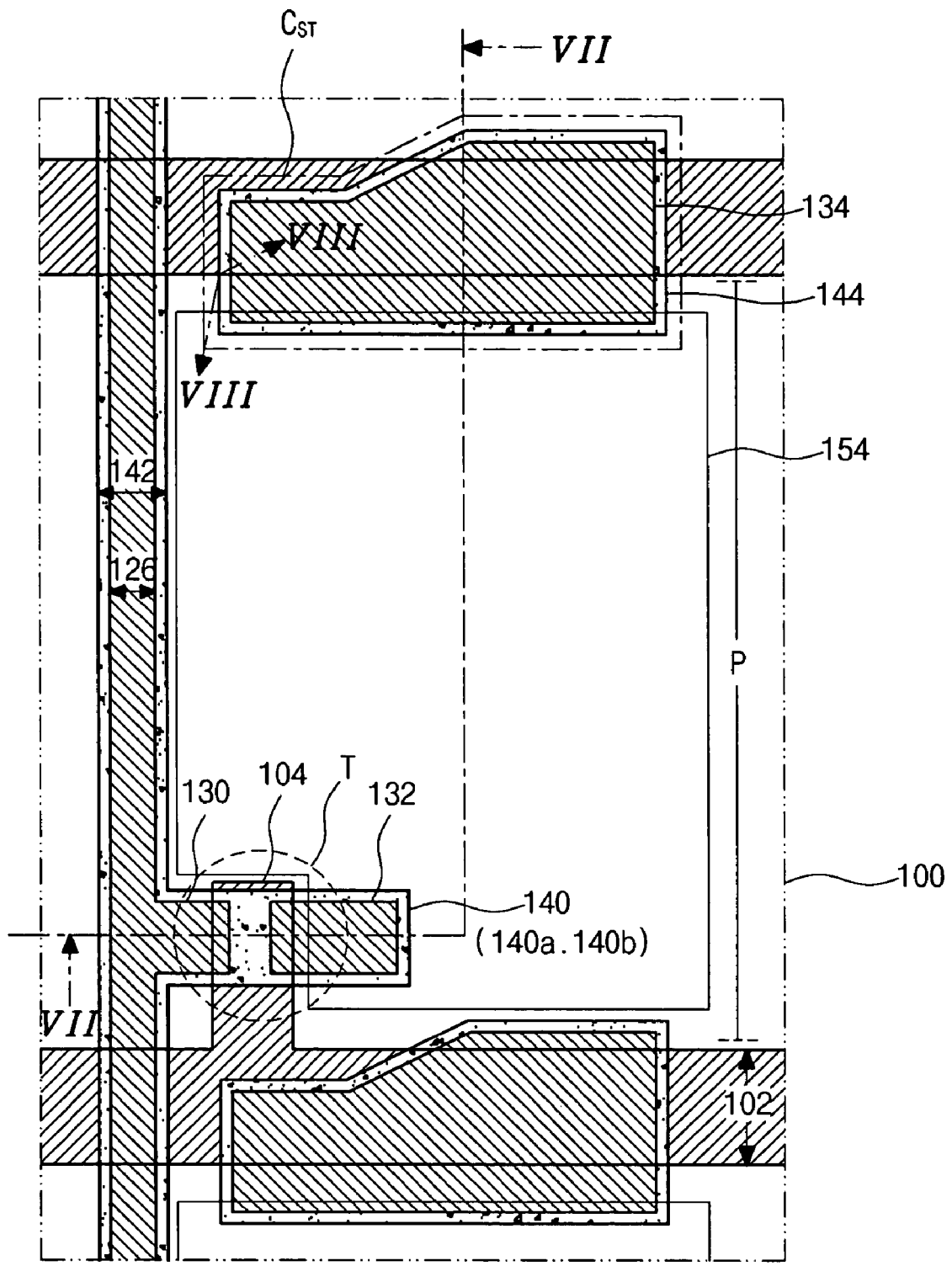
FIG. 6 is a plan view of an array substrate including a metal pattern that has a side parallel to a gate line and contacting a pixel electrode.
Figure 7:
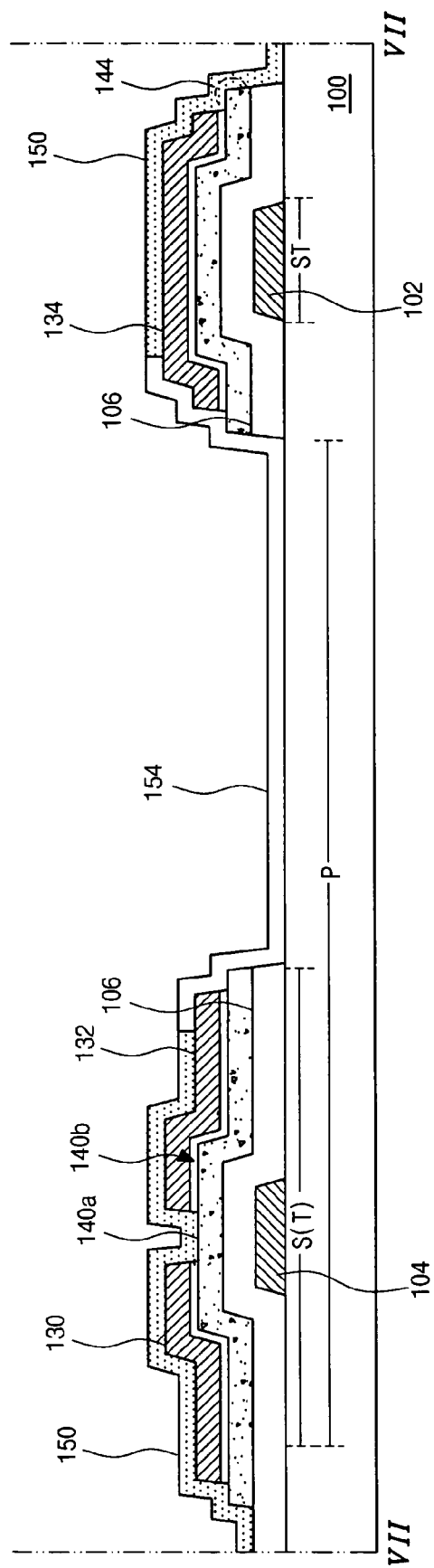
FIG. 7 is a cross-sectional view taken along the line VII-VII of FIG. 6.
Figure 8A:
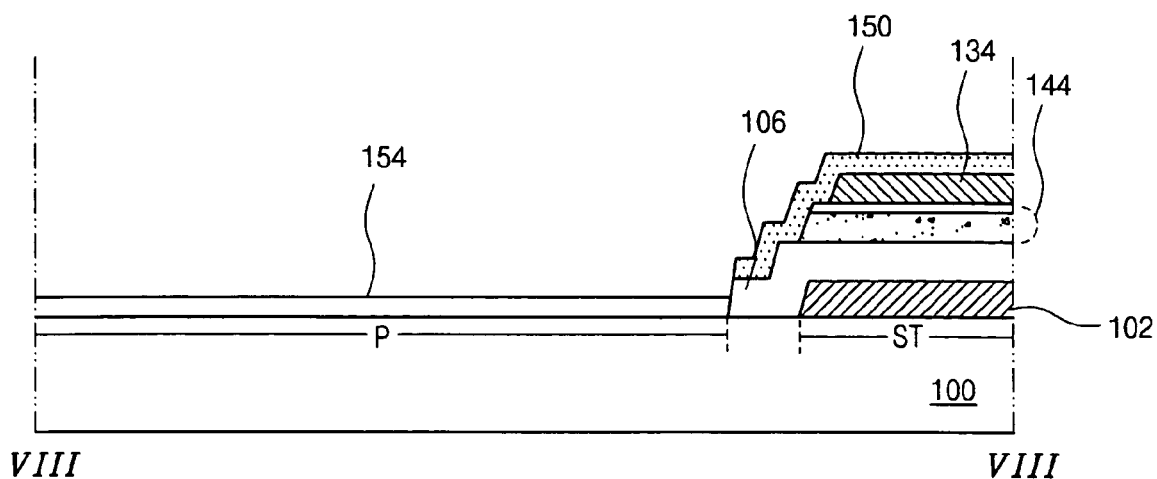
FIGS. 8A and 8B are cross-sectional views taken along the line VIII-VIII of FIG. 6.
Figure 8B:
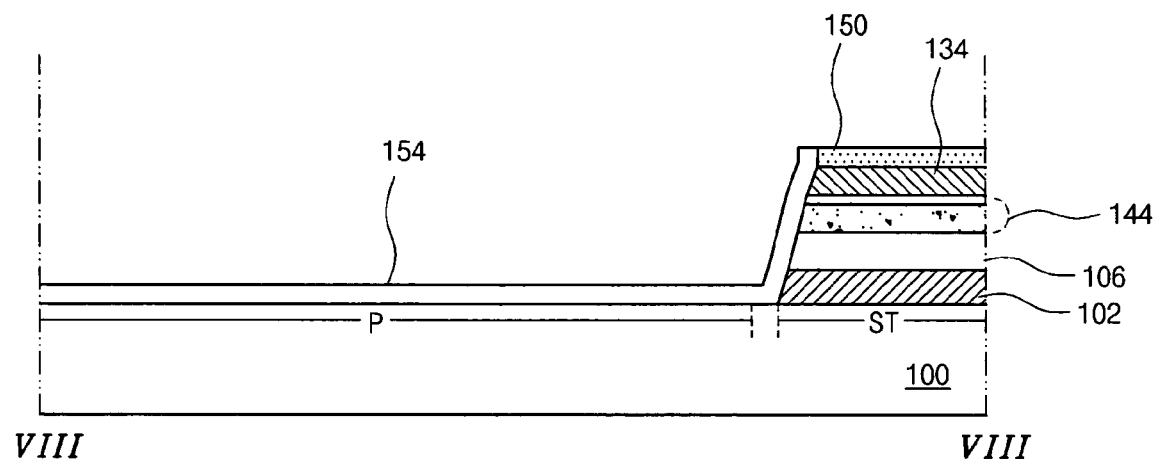

FIGS. 6 and 7 and FIGS. 8A and 8B illustrate an array substrate including a metal pattern that has a side parallel to a gate line and contacting a pixel electrode. FIG. 6 is a plan view of the array substrate, and FIG. 7 is a cross-sectional view taken along the line VII-VII of FIG. 6. FIGS. 8A and 8B are cross-sectional views taken along the line VIII-VIII of FIG. 6.

In FIGS. 6 and 7, a pixel region P including a switching region S and a storage region ST are defined on a substrate 100. A gate line 102 and a data line 126 are formed on the substrate 100 and cross each other to define the pixel region P. A thin film transistor T including a gate electrode 104, an active layer 140a, a source electrode 130 and a drain electrode 132 is formed in the switching region S at the crossing portion of the gate and data lines 102 and 126. A metal pattern 134 is formed over the gate line 102 in the storage region ST. A pixel electrode 154 is formed in the pixel region P and contacts the drain electrode 132 and the metal pattern 134.

First, second and third semiconductor patterns 140, 142 and 144 are formed under the source and drain electrodes 130 and 132, the data line 126 and the metal pattern 134, respectively. A gate insulating layer 106 is also formed under the first, second and third semiconductor patterns 140, 142 and 144. Each of the first, second and third semiconductor patterns 140, 142 and 144 includes an intrinsic amorphous silicon layer and an impurity-doped amorphous silicon layer. The intrinsic amorphous silicon layer 140a under the source and drain electrodes 130 and 132 functions as an active layer, and the impurity-doped amorphous silicon layer 140b under the source and drain electrodes 130 and 132 acts as an ohmic contact layer.

A passivation layer 150 covers the source and drain electrodes 130 and 132 and the metal pattern 134. To form the passivation layer 150, a photosensitive organic pattern is formed on the source and drain electrodes 130 and 132 in the switching region S and the metal pattern 134 in the storage region ST. The photosensitive organic pattern may peel off the underlying layers due to stepped sides of the metal pattern 134 and the third semiconductor pattern 144, and thus the gate line 102 may be exposed when the passivation layer 150 is etched.

FIGS. 8A and 8B are cross-sectional views illustrating a part of the metal pattern crossing the gate line. FIG. 8A shows a normal condition and FIG. 8B shows a defective condition.

In FIGS. 8A and 8B, the gate line 102 is formed on the substrate 100, and the gate insulating layer 106, the third semiconductor pattern 144, the metal pattern 134 and the passivation layer 150 are sequentially formed on the gate line 102. The transparent pixel electrode 154 is formed in the pixel region P.

The third semiconductor pattern 144 and the metal pattern 134 are formed through the same mask process, and the gate insulating layer 106 is patterned through the same mask process as the passivation layer 150. Since a part of the metal pattern 134 crossing the gate line 102 does not contact the pixel electrode 154, the passivation layer 150 and the gate insulating layer 106 are etched so that the metal pattern 134 is not exposed.

However, when the part of the metal pattern 134 crossing the gate line 102 is close to a part of the metal pattern 134 contacting the pixel electrode 154, a photosensitive organic pattern for forming the passivation layer 150 may come off the underlying layer due to a step of the metal pattern 134, and thus the passivation layer 150 and the gate insulating layer 106 may be over-etched, whereby a side of the gate line 102 may be exposed. Next, if a transparent conductive material is deposited on the entire surface of the substrate 100 and then the photosensitive organic pattern is removed to form the pixel electrode, the pixel electrode 154 may contact the exposed gate line 102. This creates point defects in which pixels are not driven due to contact between the pixel electrode 154 and the gate line 102. The point defects may be partially crowed, thereby causing problems in the liquid crystal display panel.

To solve the above problems, the array substrate of the present invention has the structure shown in FIG. 4. That is, the array substrate of the present invention includes a storage capacitor electrode having at least one curved portion in a side contacting a pixel electrode.

Figure 9:
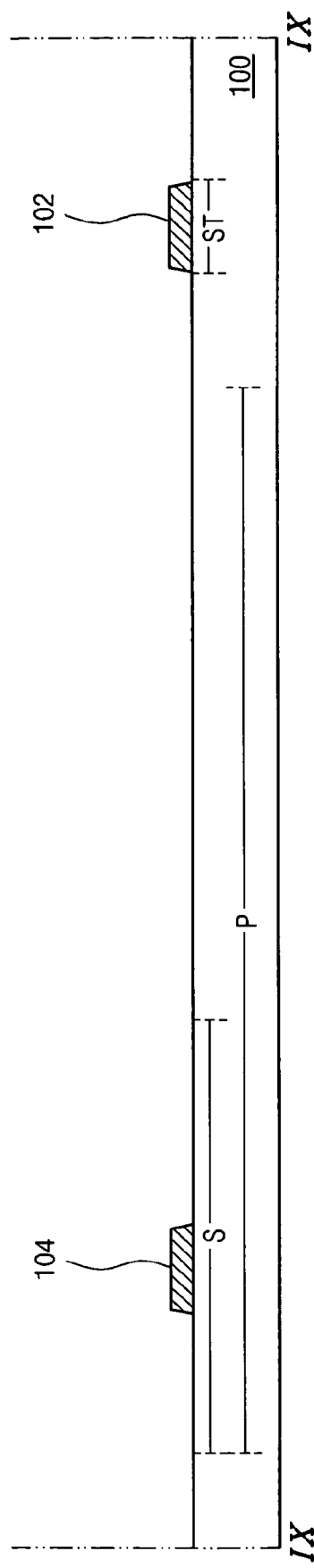
FIGS. 9 and 10 are cross-sectional views illustrating a first mask process of the array substrate for the liquid crystal display device of the present invention.
Figure 10:
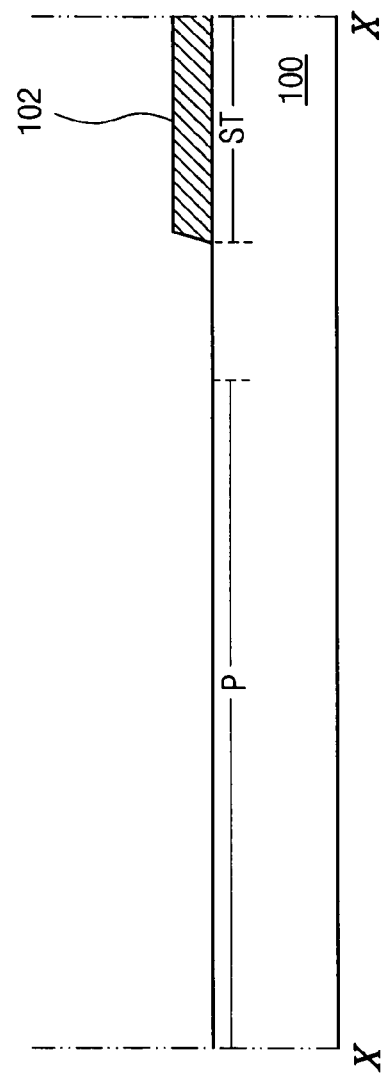
Figure 15:
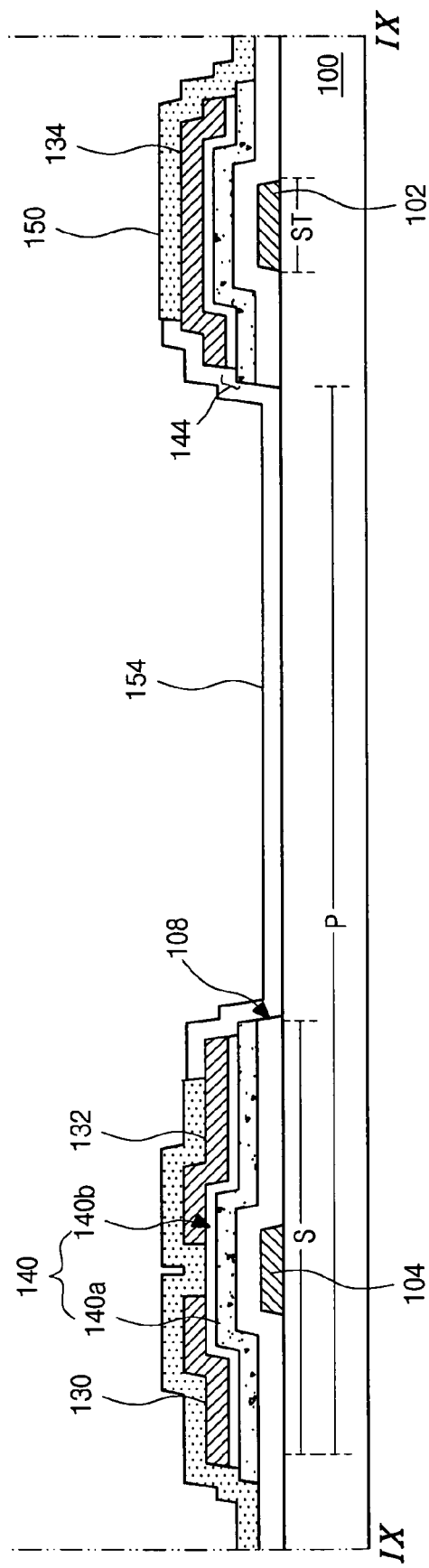
FIGS. 15 and 16 are cross-sectional views illustrating a completed array substrate of the present invention.
Figure 16:
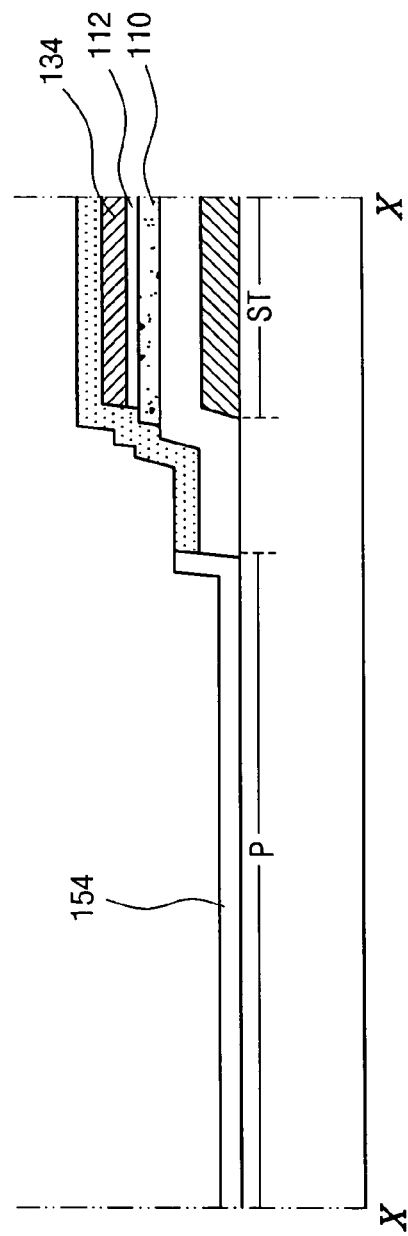

Hereinafter, a method of manufacturing a liquid crystal display device of the present invention will be explained with reference to attached drawings. FIGS. 9 and 10 illustrate a first mask process of the array substrate for the liquid crystal display device of the present invention and are cross-sectional views corresponding to the line IX-IX and the line X-X of FIG. 4, respectively. FIGS. 11A to 11F and FIGS. 12A to 12F illustrate a second mask process and are cross-sectional views corresponding to the line IX-IX and the line X-X of FIG. 4, respectively. FIGS. 13A to 13C and FIGS. 14A to 14C illustrate a third mask process and are cross-sectional views corresponding to the line IX-IX and the line X-X of FIG. 4, respectively. FIGS. 15 and 16 illustrate a completed array substrate of the present invention and are cross-sectional views corresponding to the line IX-IX and the line X-X of FIG. 4, respectively.

In FIGS. 9 and 10, a pixel region P including a switching region S and a storage region ST are defined on a substrate 100. A conductive metallic material such as aluminum (Al), tungsten (W), molybdenum (Mo) or chromium (Cr) is formed on the entire surface of the substrate 100 and then is patterned through a first mask process to form a gate line 102 and a gate electrode 104. The gate electrode 104 is connected to the gate line 102.

In order to prevent resistance-capacitance (RC) delay, aluminum (Al), which has a relatively low resistivity, is widely used as a gate electrode material. However, pure aluminum is easily corroded by acid and may cause line defects due to hillocks in the following process under high temperatures. Therefore, an aluminum alloy may be used or a double layer including aluminum and other metal material, such as molybdenum.

FIGS. 11A to 11F and FIGS. 12A and 12F illustrate a second mask process.

Figure 11A:
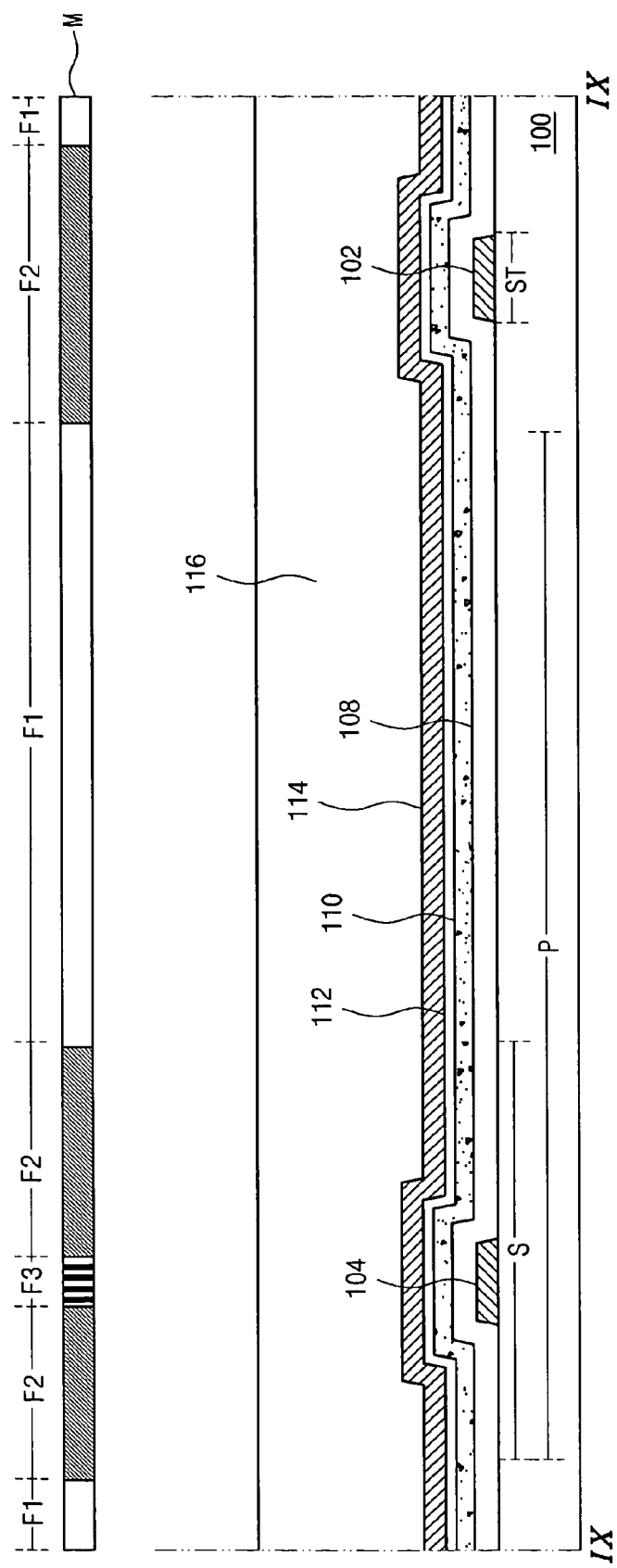
Figure 12A:
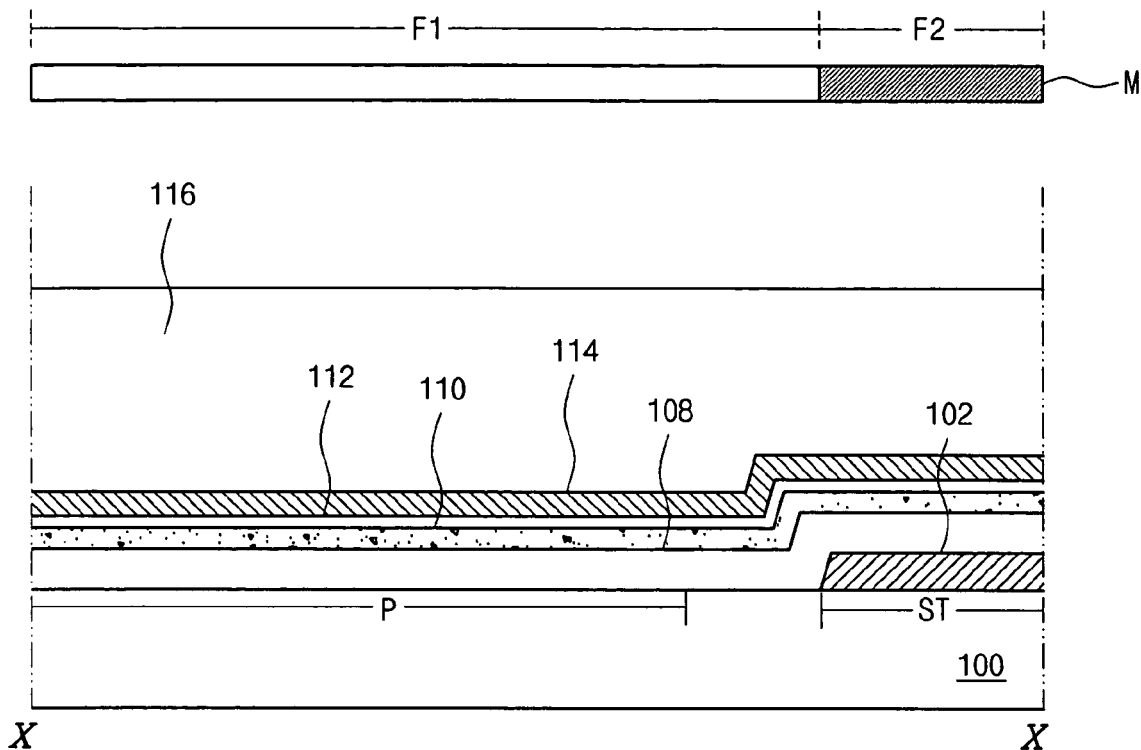

In FIGS. 11A and 12A, a gate insulating layer 108 is formed on the entire surface of the substrate 100 including the gate line 102 and the gate electrode 104 thereon by depositing an inorganic insulating material such as silicon nitride ($SiN_x$) or silicon oxide ($SiO_2$) or coating an organic insulating material benzocyclobutene (BCB) or acrylic resin.

Subsequently, an intrinsic amorphous silicon layer (a-Si: H) 110, an impurity-doped amorphous silicon layer (n+a-Si: H) 112 and a metallic layer 114 are formed on the gate insulating layer 108. The metallic layer 114 is formed of chromium (Cr), molybdenum (Mo), tungsten (W) or tantalum (Ta).

Next, a photoresist (PR) layer 116 is formed on the metallic layer 114 by coating photoresist. A mask M, which has a transmitting portion F1, a blocking portion F2 and a half transmitting portion F3, is disposed over and spaced apart from the photoresist layer 116. The blocking portion F2 corresponds to the switching region S, the storage region ST and a data line (not shown) to be formed later. The half transmitting portion F3 may include slits and corresponds to a channel of a thin film transistor, which will be formed at a center portion of the gate electrode 104 in the switching region S. The transmitting portion F1 corresponds to the other regions. The photoresist layer 116 may be a positive type, and thus a portion exposed to light is developed and removed. Subsequently, the photoresist layer 116 is exposed to light, and the photoresist layer 116 corresponding to the half transmitting portion F3 is exposed less than the photoresist layer 116 corresponding to the transmitting portion F1.

Figure 1:
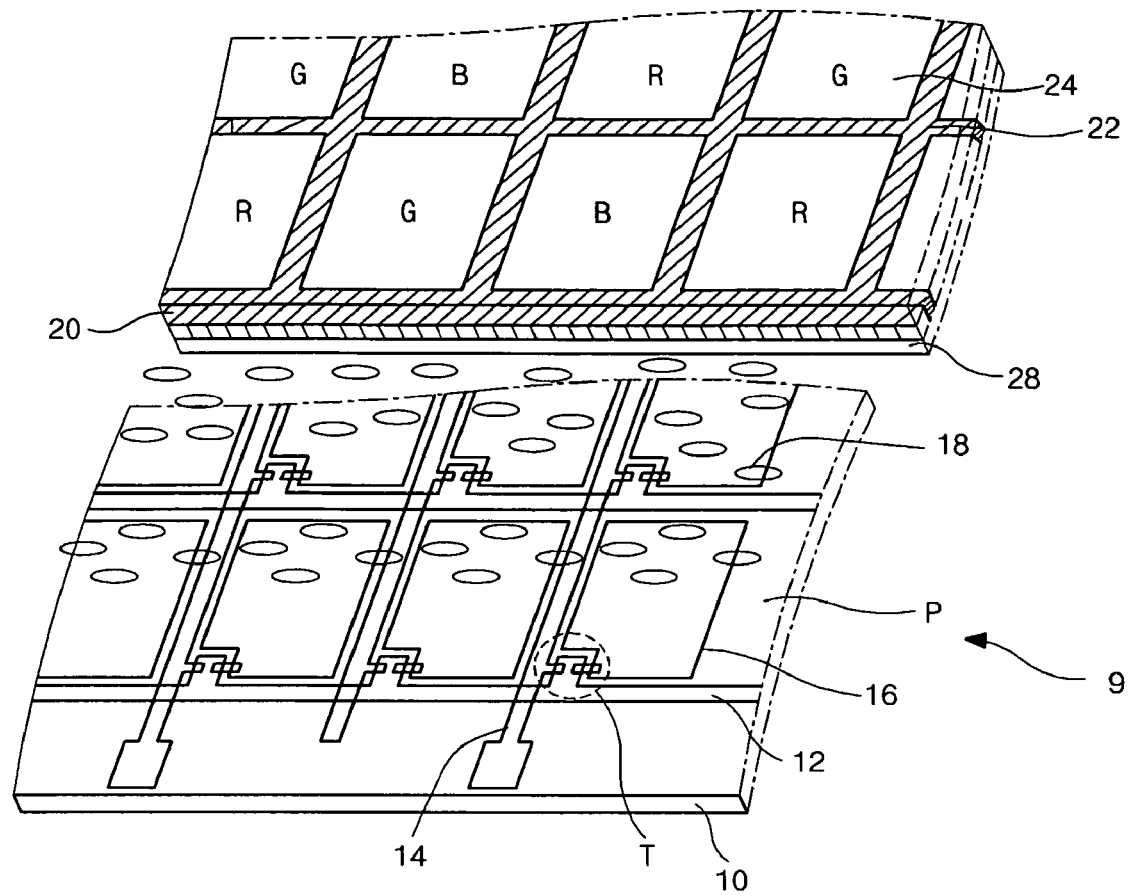
FIG. 1 is an exploded perspective view illustrating a related art liquid crystal display (LCD) device.
Figure 2:
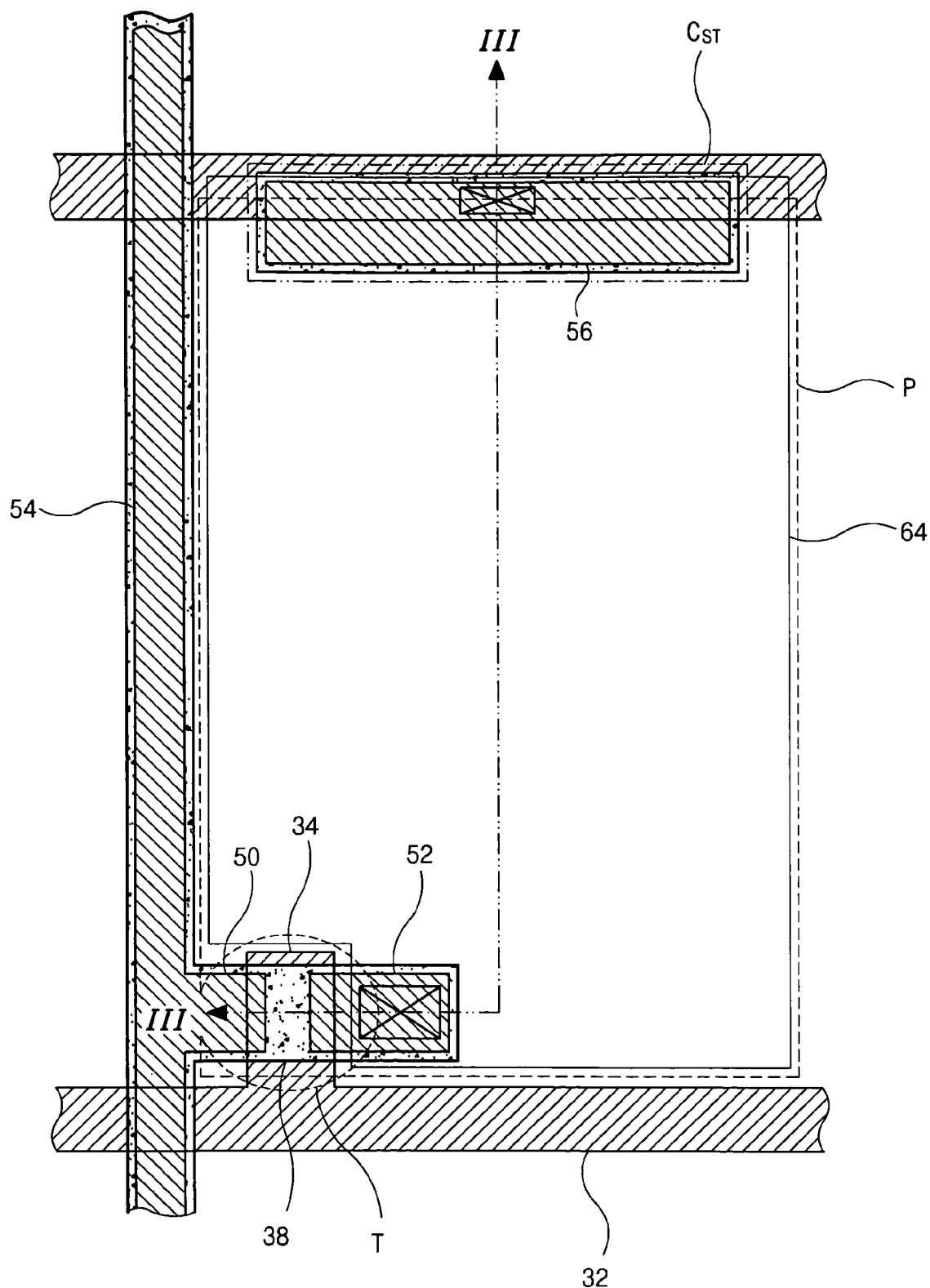
FIG. 2 is a plan view of an array substrate for an LCD device fabricated through four-mask processes according to the related art.
Figure 3A:
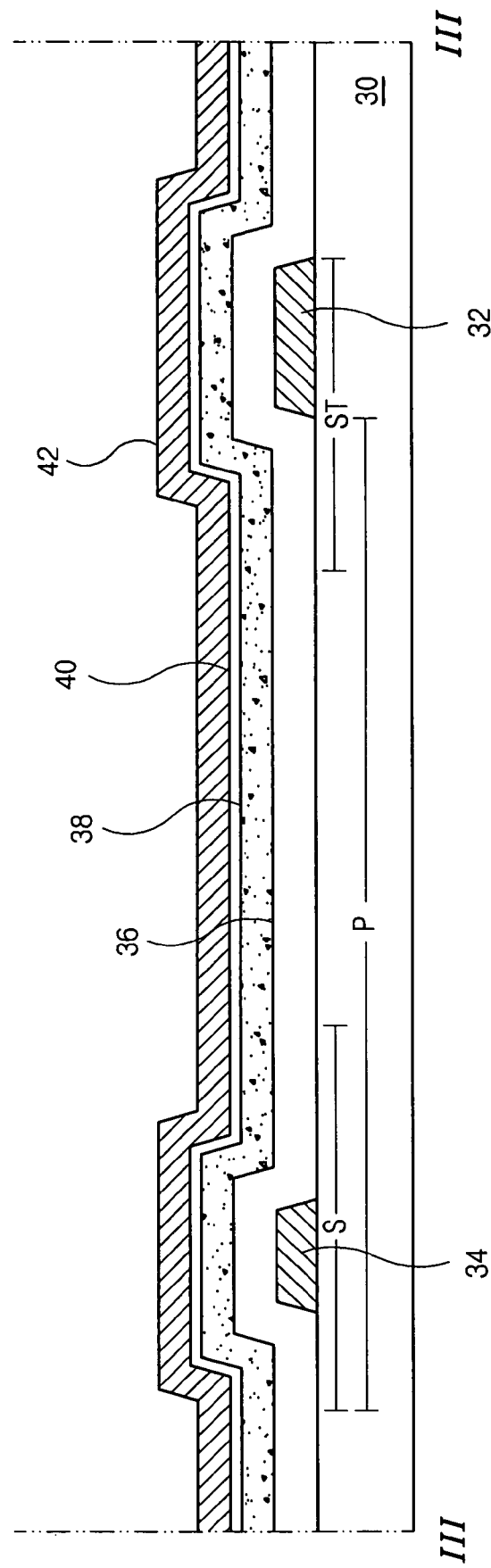
FIGS. 3A to 3H are cross-sectional views taken along the line III-III of FIG. 2 illustrating a method of manufacturing an array substrate according to the related art.
Figure 3B:
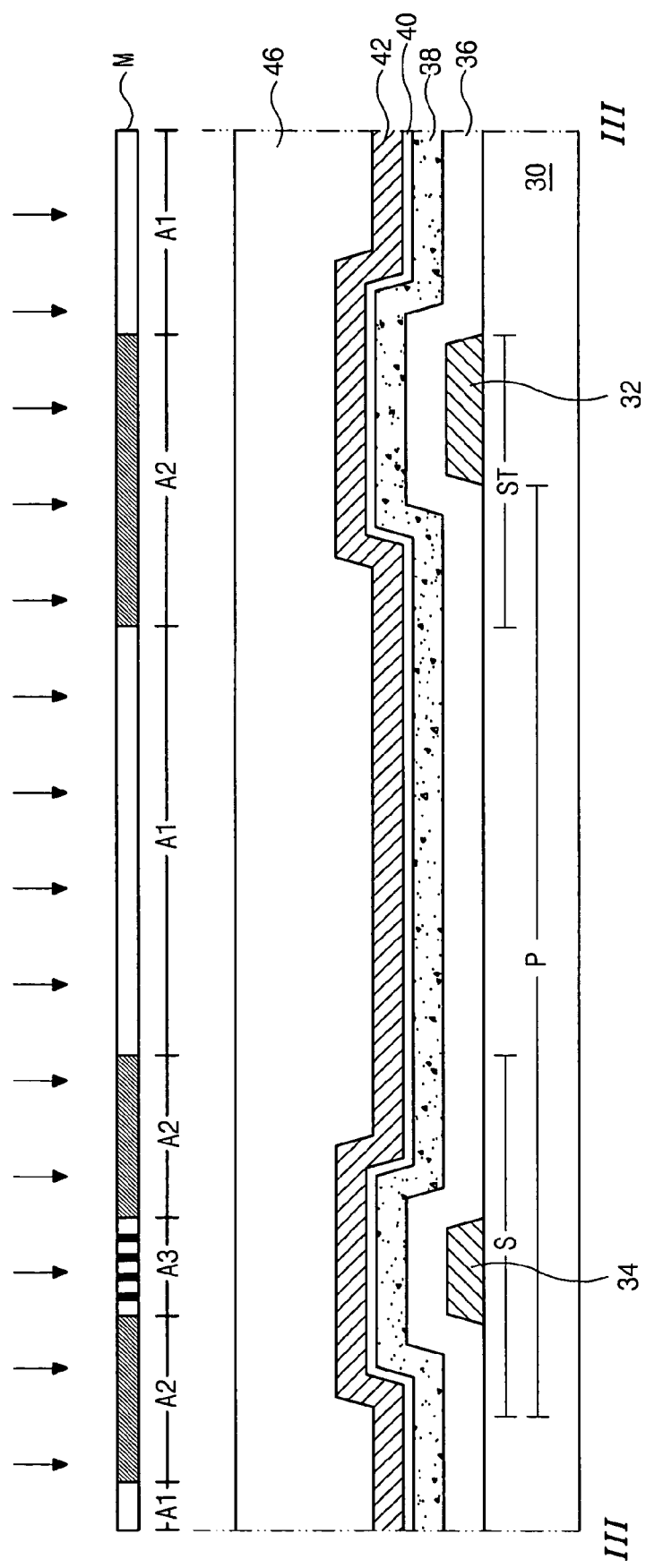
Figure 3C:
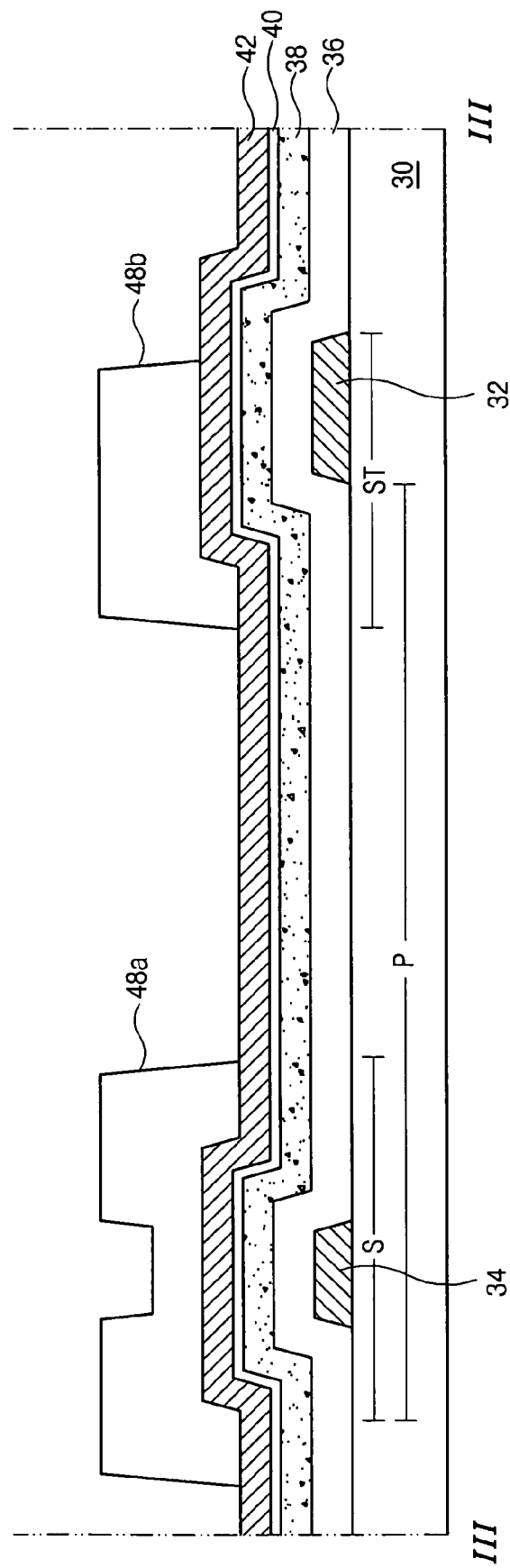
Figure 3D:
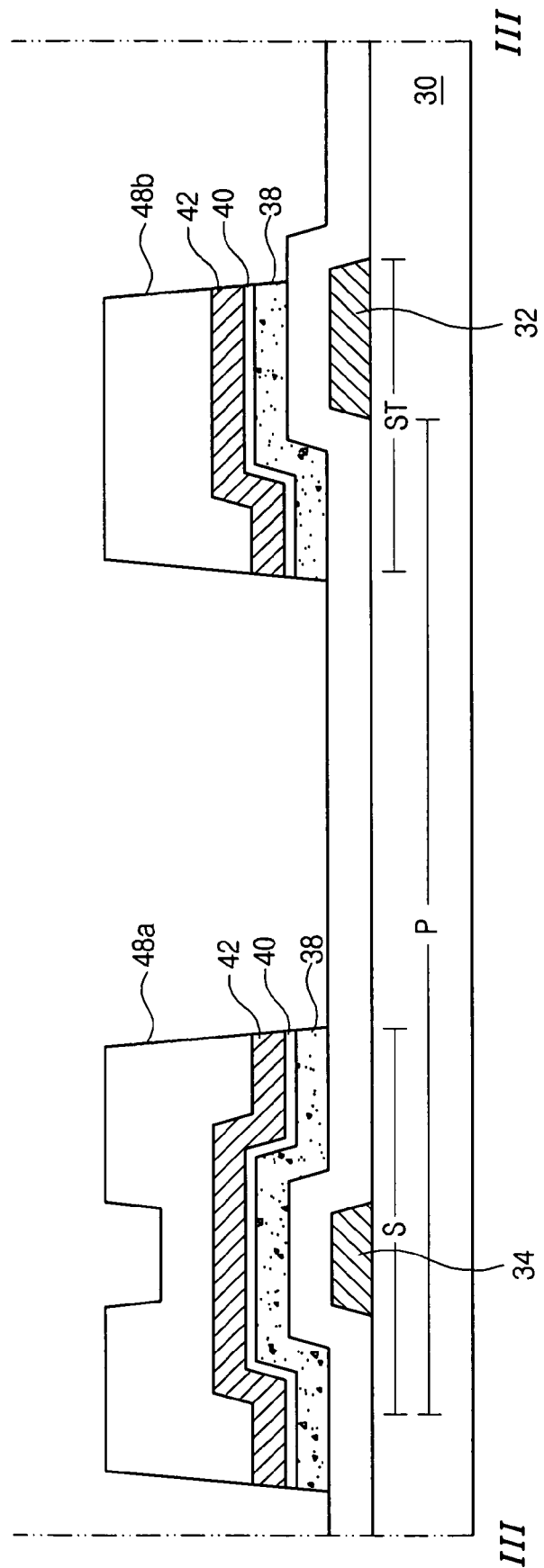
Figure 3E:
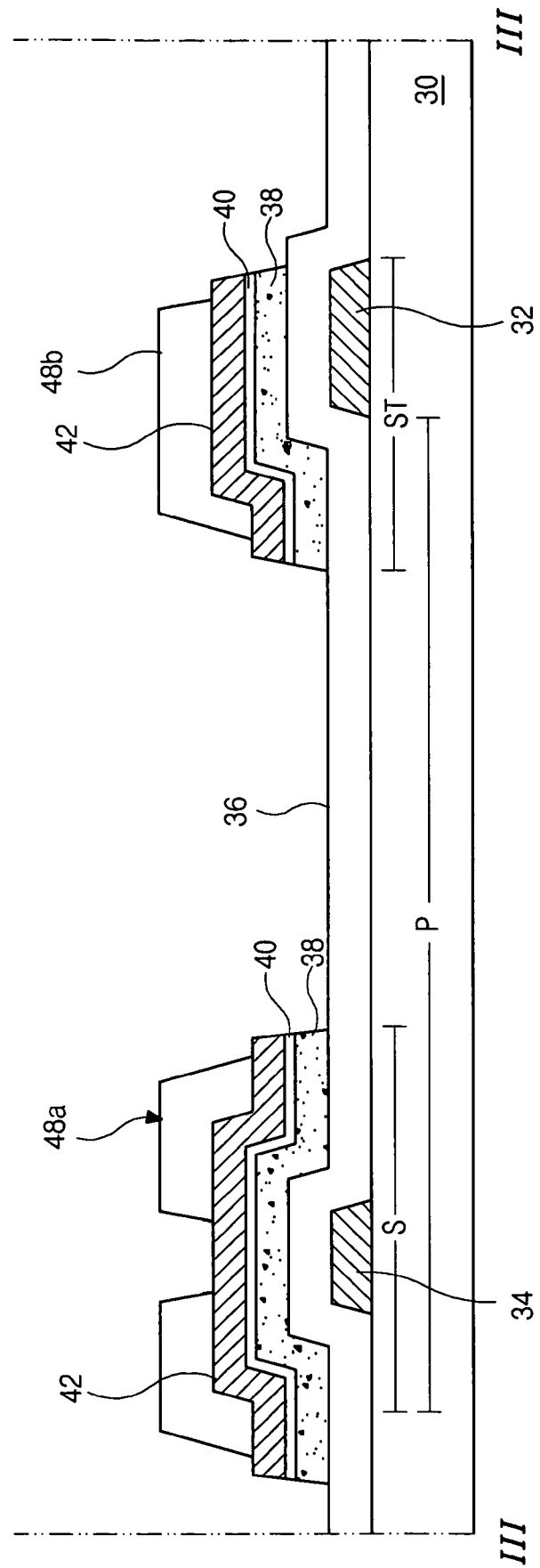
Figure 3F:
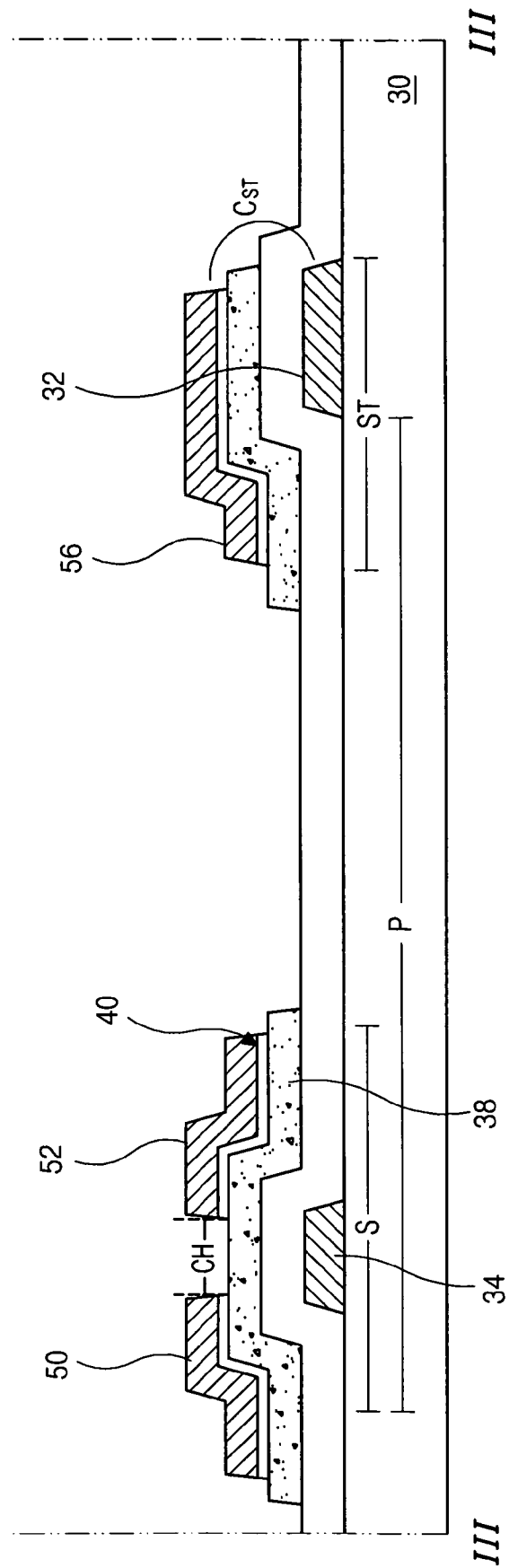
Figure 3G:
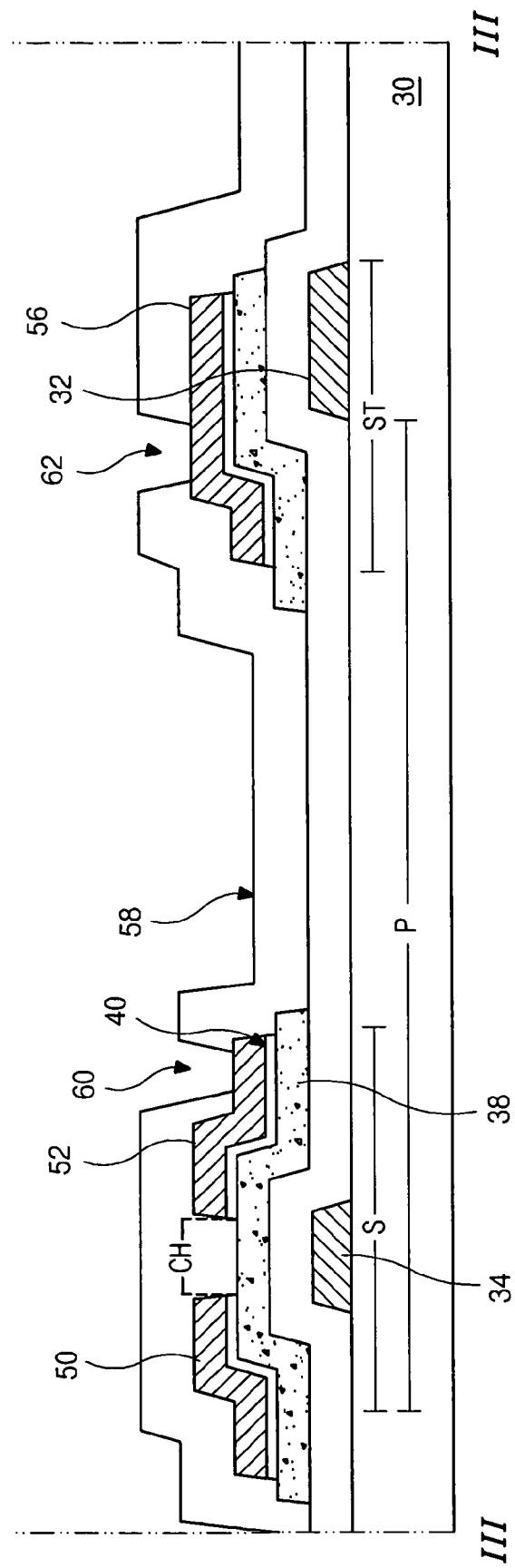
Figure 3H:
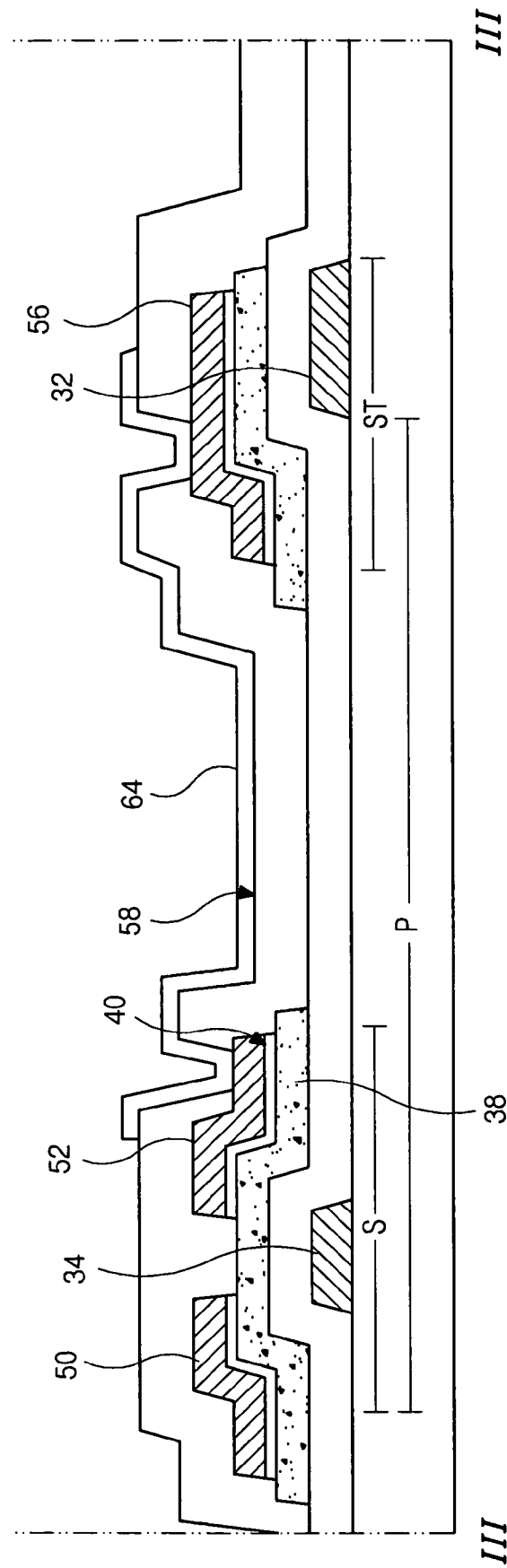
Figure 12B:
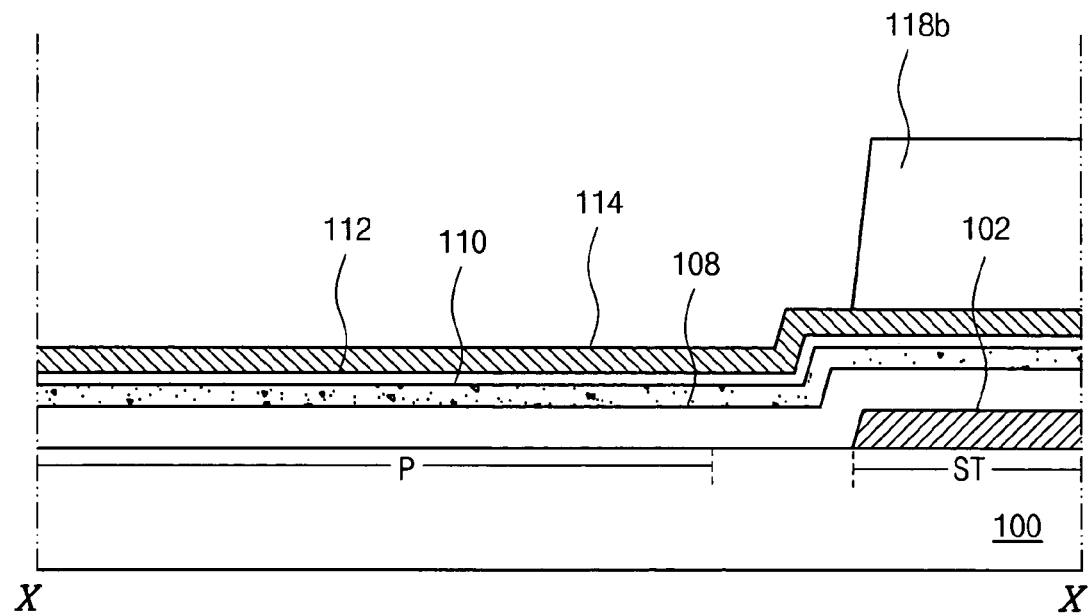

As illustrated in FIGS. 101B and 12B, the photoresist layer 116 of FIGS. 1A and 12A is developed, and a first photoresist pattern 118a and a second photoresist pattern 118b are formed. The first photoresist pattern 118a corresponds to the switching region S and has different thicknesses. The second photoresist pattern 118b corresponds to the storage region ST. A first thickness of the first photoresist pattern 118a corresponds to the blocking portion F2 of FIG. 11A, and a second thickness of the first photoresist pattern 118a, which is thinner than the first thickness, corresponds to the half transmitting portion F3 of FIG. 11A. The second photoresist pattern 118b has the same thickness as the first thickness of the first photoresist pattern 118a.

Figure 11B:
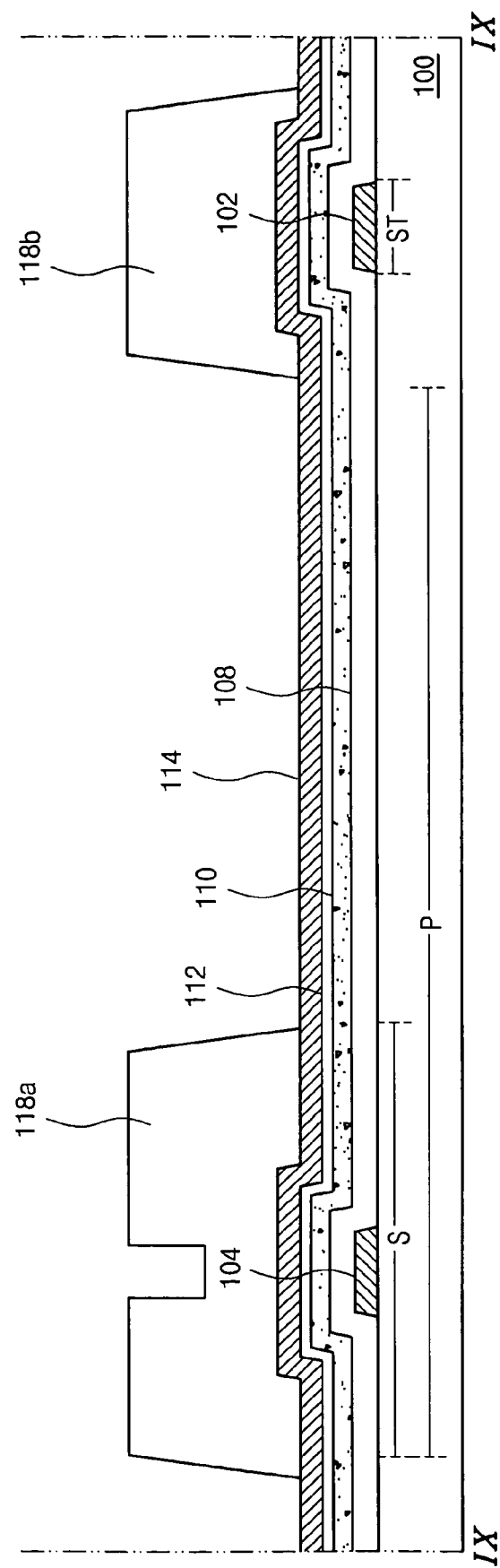
Figure 11C:
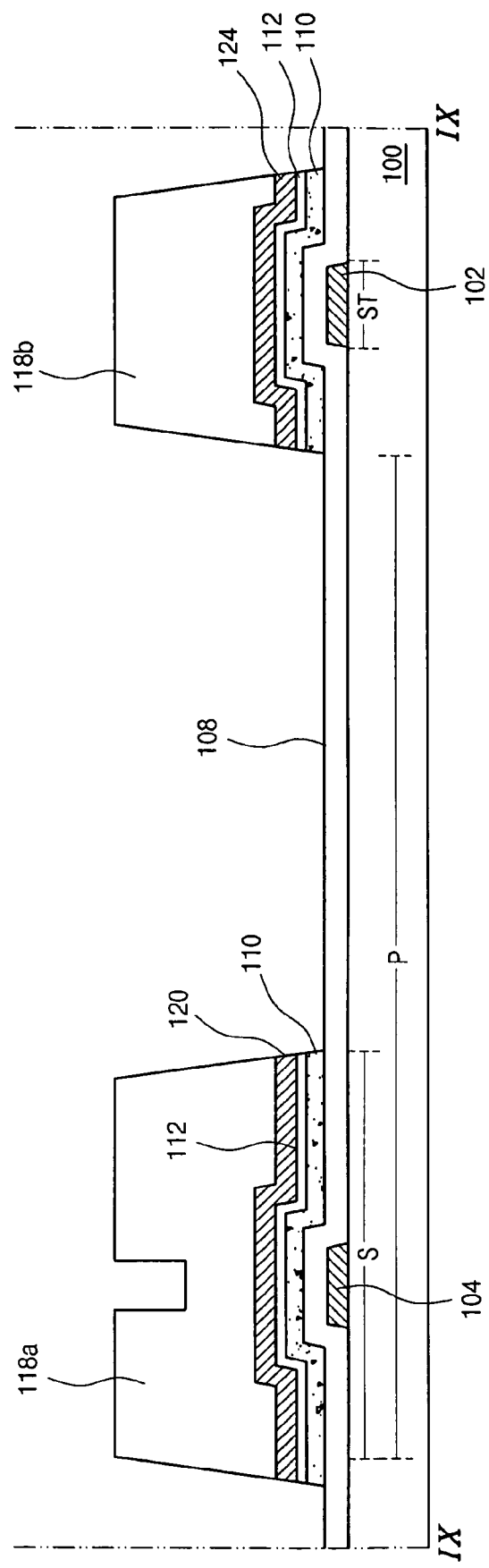
Figure 12C:
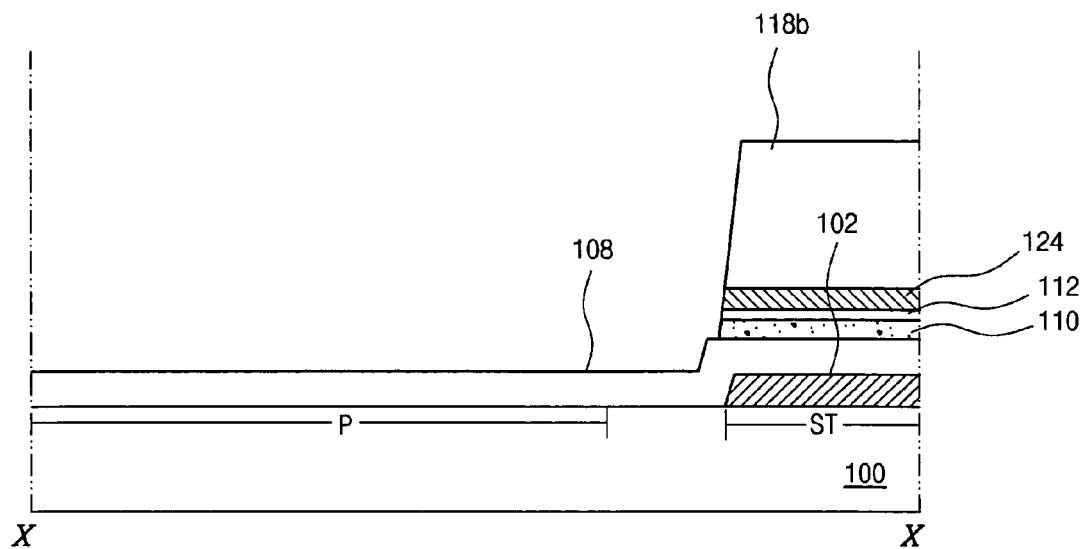

As illustrated in FIGS. 11C and 12C, the metallic layer 114, the impurity-doped amorphous silicon layer 112 and the intrinsic amorphous silicon layer 110 of FIGS. 11B and 12B exposed by the first and second photoresist patterns 118a and 118b are removed. Thus, a source and drain pattern 120 and a metal pattern 124 of an island shape are formed in the switching region S and the storage region ST, respectively. The impurity-doped amorphous silicon layer 112 and the intrinsic amorphous silicon layer 110 is patterned and have the same shape as the source and drain pattern 120 and the metal pattern 124. At this time, a data line (not shown), which is connected to the source and drain pattern 120 and crosses the gate line 102, is formed.

Next, as illustrated in 11D and 12D, the second thickness of the first photoresist pattern 118a of FIG. 11C is removed through an ashing process, and thus the middle portion of the source and drain pattern 120 is exposed. Here, the first thickness of the first photoresist pattern 118a and the second photoresist pattern 118b are also removed partially and the first thickness of the photoresist pattern 118a and the second photoresist pattern 118b are thinned. Additionally, edges of the first and second photoresist patterns 118a are removed, and peripheral portions E1 of the source and drain pattern 120 and the metal pattern 124 are exposed.

Figure 12D:
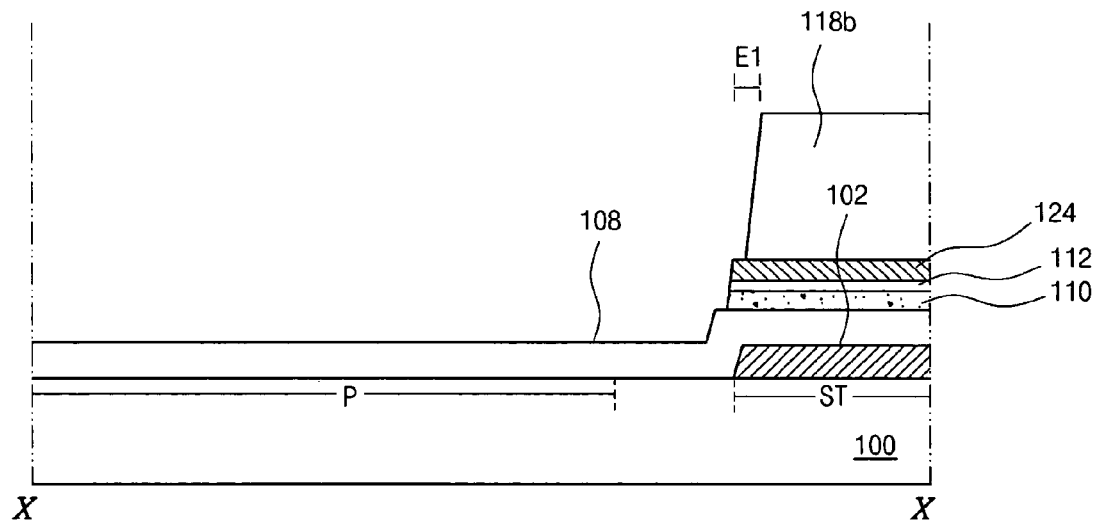
Figure 12E:
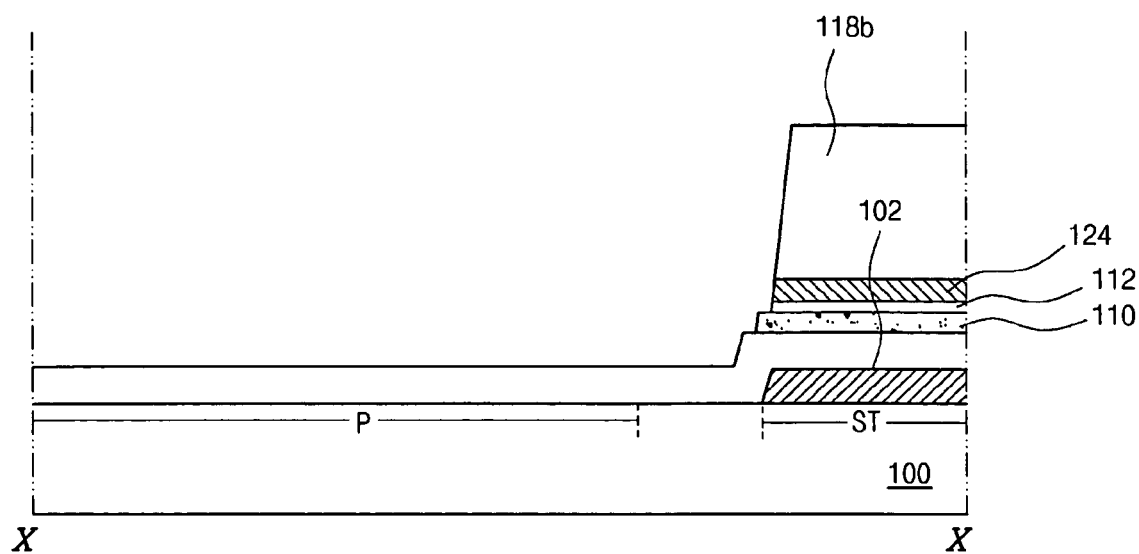

As illustrated in FIGS. 11E and 12E, the source and drain pattern 120 and the impurity-doped amorphous silicon layer 112 of FIG. 11D, which are exposed by the first photoresist pattern 118a, are etched. At this time, the peripheral portions E1 of the source and drain pattern 120 and the metal pattern 124 and corresponding parts of the impurity-doped amorphous silicon layer 112 of FIGS. 11D and 12D are also etched.

Figure 11F:
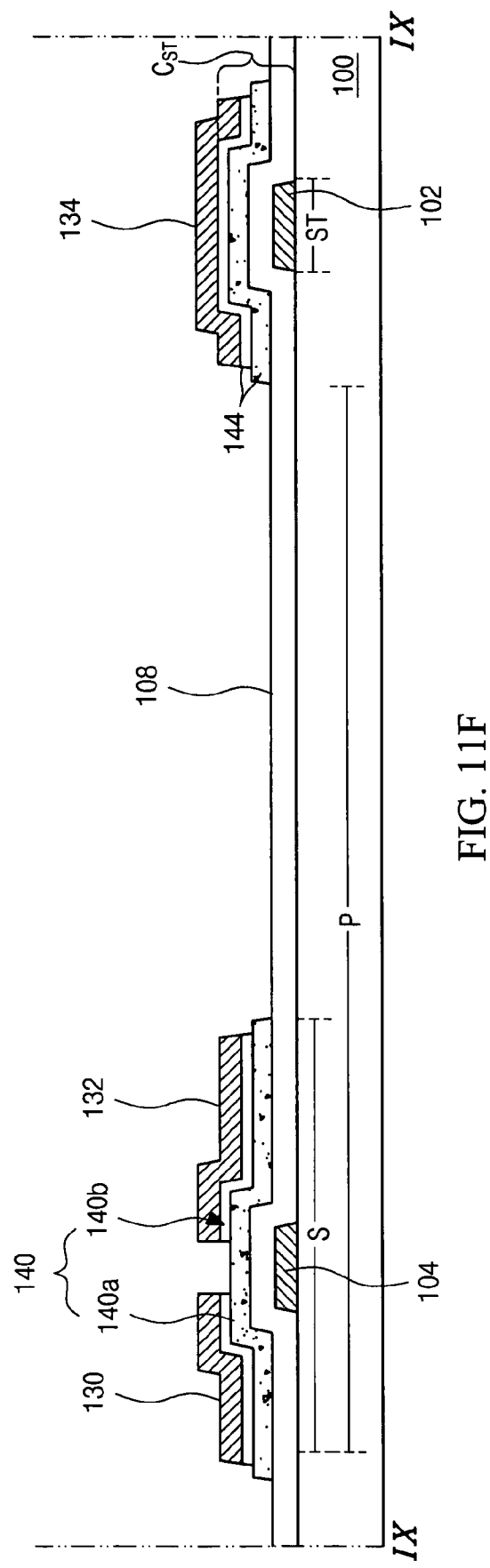
Figure 12F:
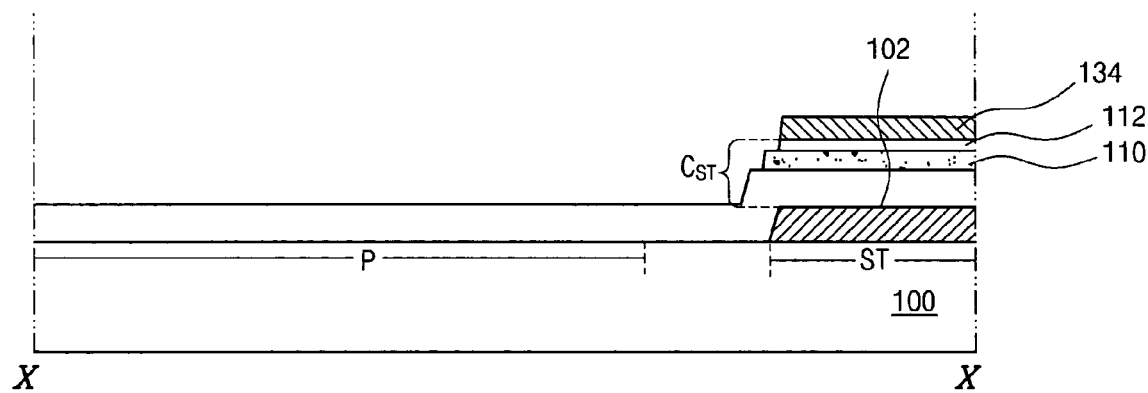

Next, as illustrate in FIGS. 11F and 12F, the first and second photoresist patterns 118a and 118b of FIG. 11E and 12E are removed. Thus, source and drain electrodes 130 and 132 are formed. The source and drain electrodes 130 and 132 are spaced apart from each other. The metal pattern 124 of FIG. 11E over the gate line 102 in the storage region ST is used as an electrode 134 for a storage capacitor $C_{ST}$. The gate line 102 functions as a first electrode of the storage capacitor $C_{ST}$, and the metal pattern 134 functions as a second electrode of the storage capacitor $C_{ST}$.

Here, a first semiconductor pattern 140, a second semiconductor pattern 142 of FIG. 4 and a third semiconductor pattern 144 are formed under the source and drain electrodes 140 and 142, the data line 126 and the metal pattern 134, respectively. Each semiconductor pattern 140, 142 and 144 includes the impurity-doped amorphous silicon layer and the intrinsic amorphous silicon layer. The intrinsic amorphous silicon layer of the first semiconductor pattern 140 is referred to an active layer 140a, and the impurity-doped amorphous silicon layer of the first semiconductor pattern 140 is referred to as an ohmic contact layer 140b.

Figure 13A:
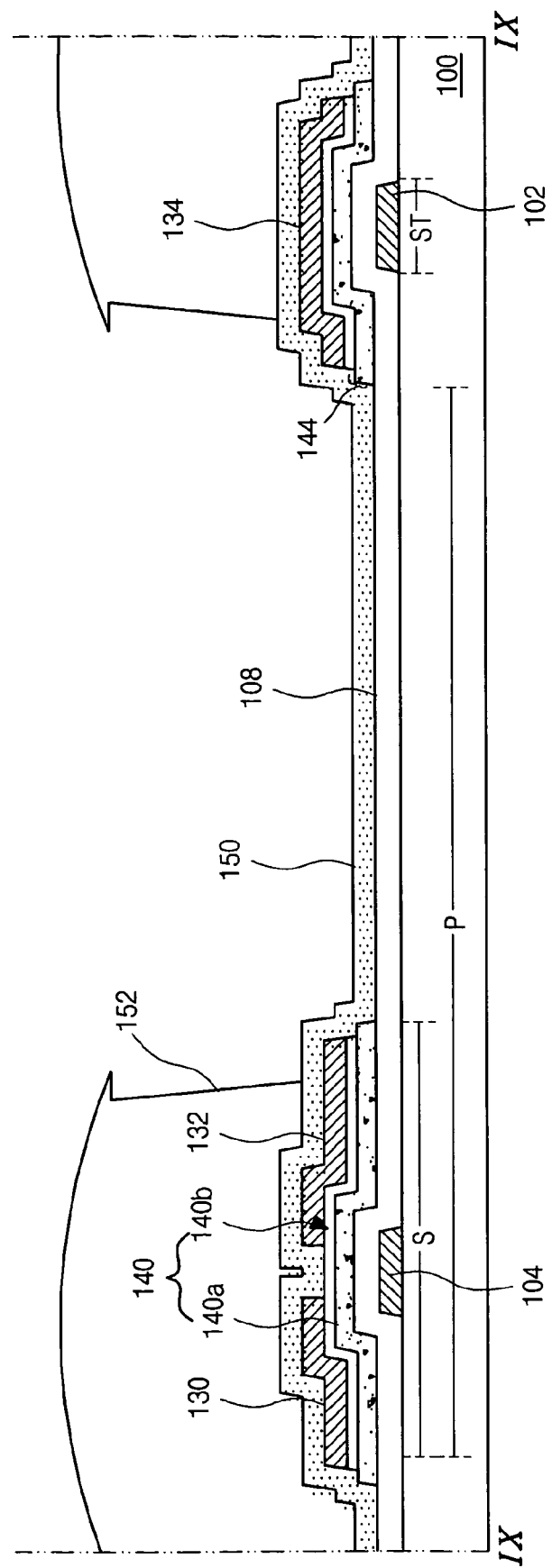
FIGS. 13A to 13C and FIGS. 14A to 14C are cross-sectional views illustrating a third mask process.
Figure 13B:
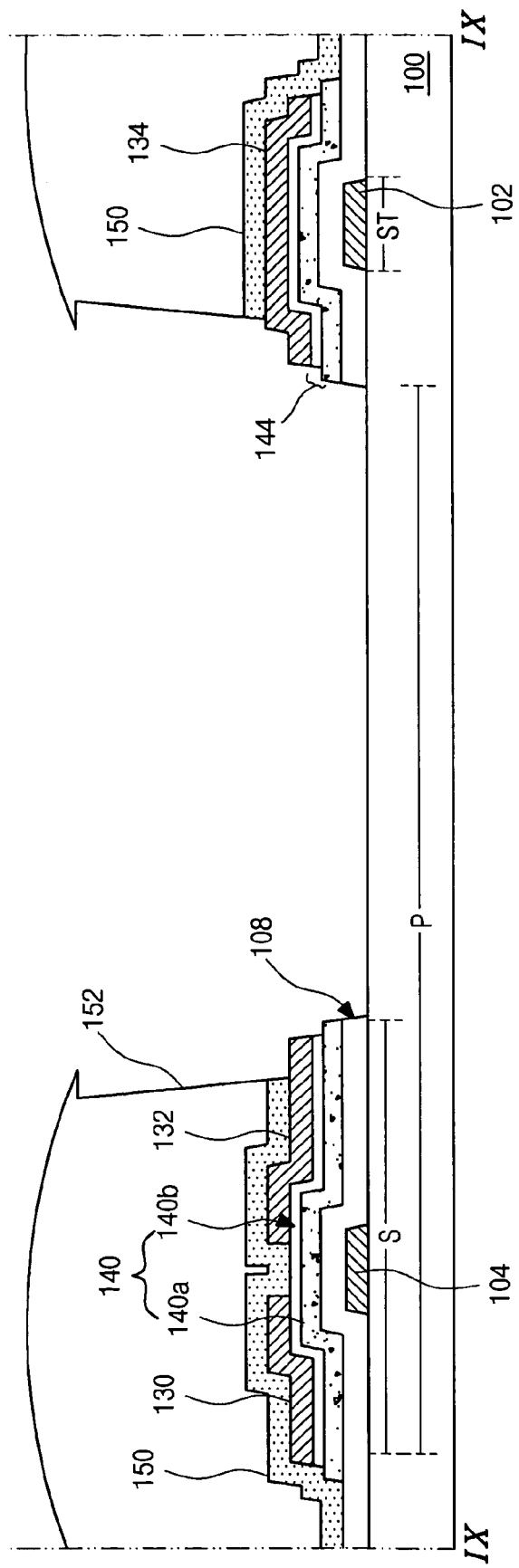
Figure 13C:
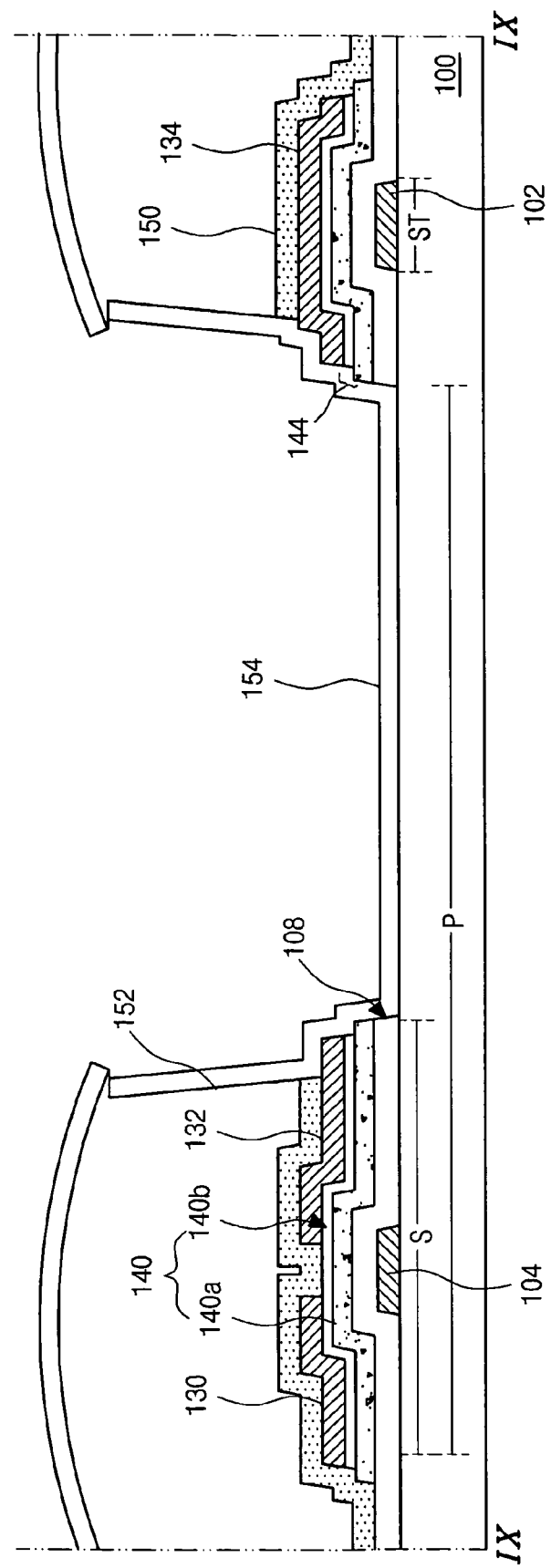
Figure 14A:
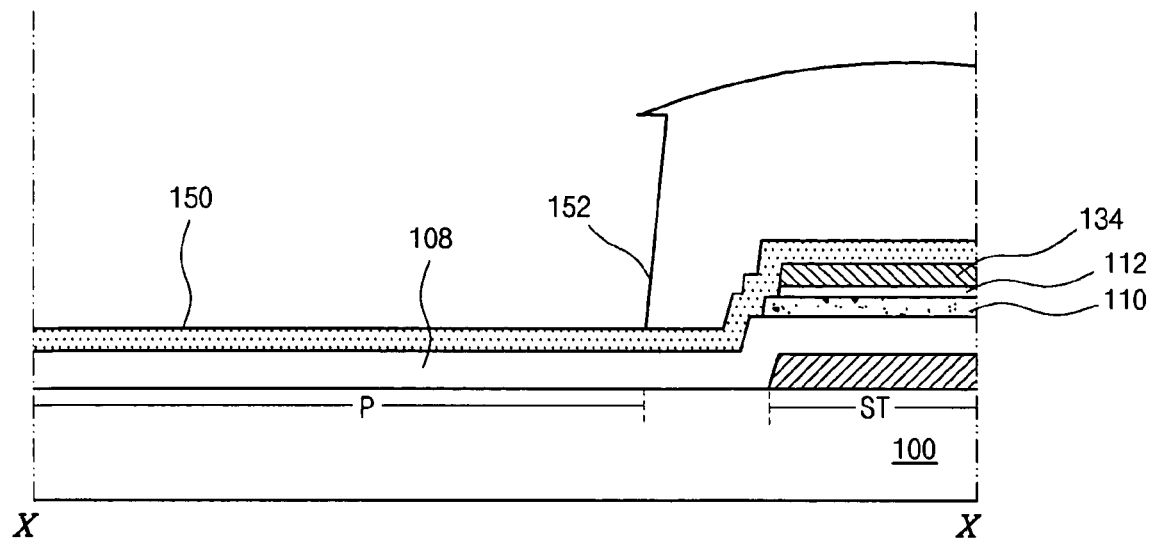

FIGS. 13A to 13C and FIGS. 14A to 14C illustrate a third mask process. In FIGS. 13A and 14A, a passivation layer 150 is formed on the entire surface of the substrate 100 including the source and drain electrodes 130 and 132 and the metal pattern 134 thereon by depositing an inorganic insulating material group such as silicon nitride ($SiN_x$) or silicon oxide ($SiO_2$).

Subsequently, a photosensitive organic layer is formed on the passivation layer 150 and then is patterned through a third mask process to thereby form a photosensitive organic pattern 152 exposing the pixel region P. A surface of the photosensitive organic pattern 152 has a circular arc shape in a cross-section by curing the photosensitive organic pattern 152 under predetermined temperatures. Sides of the photosensitive organic pattern 152 are inversely tapered with respect to a surface of the substrate 100. To do this, curing the photosensitive organic pattern 152 may be repeatedly performed.

Figure 14B:
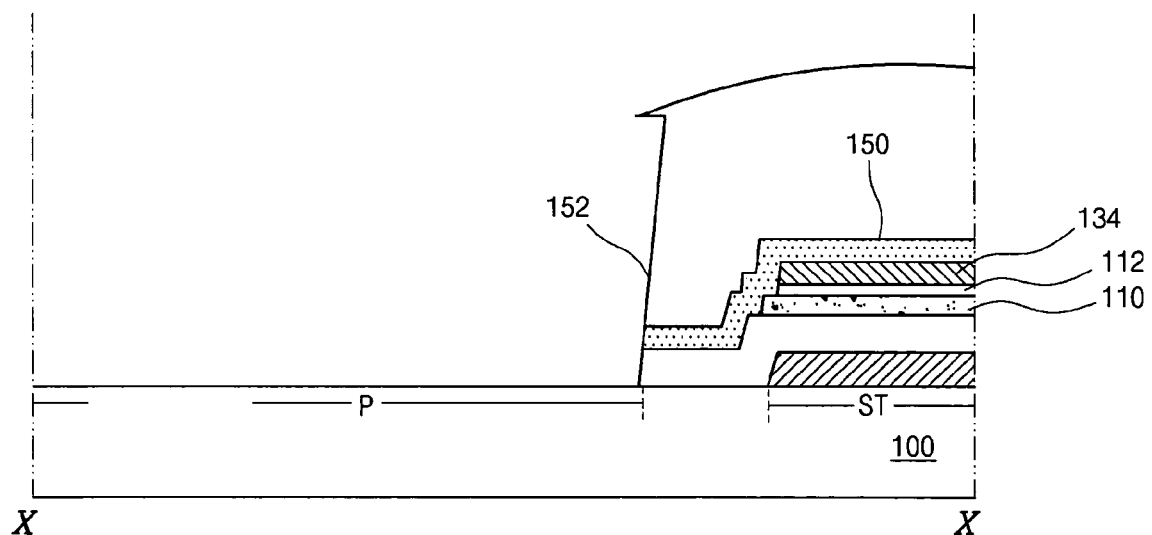

As illustrated in FIGS. 13B and 14B, the passivation layer 150 and the gate insulating layer 108 of FIGS. 13A and 14A exposed by the photosensitive organic pattern 152 are removed. Thus, a part of the drain electrode 132 and a part of the metal pattern 134 are exposed.

Figure 14C:
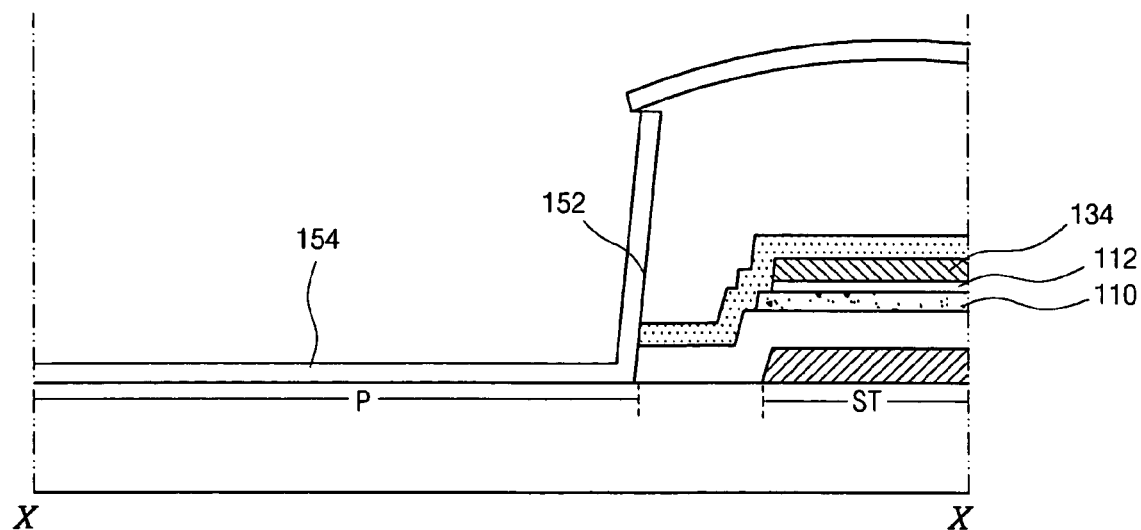

Next, as illustrated in FIGS. 13C and 14C, a transparent conductive material layer is deposited on the entire surface of the substrate 100 including the photosensitive organic pattern 152 thereon to thereby form a pixel electrode 154 connected to the exposed drain electrode 132 and the exposed metal pattern 134. Portions of the transparent conductive material layer in adjacent pixel regions are disconnected to each other due to the inversely tapered photosensitive organic pattern 152.

As illustrated in FIGS. 15 and 16, the photosensitive organic pattern 152 of FIGS. 13C and 14C is removed. At this time, the transparent conductive material layer on the photosensitive organic pattern 152 of FIGS. 13C and 14C is also removed. Therefore, the pixel electrode 154 remains in the pixel region P. This permits the array substrate for the LCD device to be manufactured through three-mask processes.

In the present invention, since the metal pattern 134 has at least one curved portion in a side contacting the pixel electrode 154, a length along sides of the metal pattern 134 between a portion overlapping the gate line 102 and a portion contacting the pixel electrode 154 is increased as compared to that in the related art. Accordingly, there is no problem that the pixel electrode 154 is connected to the gate line 102 in the storage region ST.

In FIG. 4, the side of the metal pattern 134 having the curved portion is symmetric, and a side of the pixel electrode 154 contacting the metal pattern 134 has a straight line. However, the side of the metal pattern 134 and the side of the pixel electrode 154 may have other shapes.

Figure 17A:
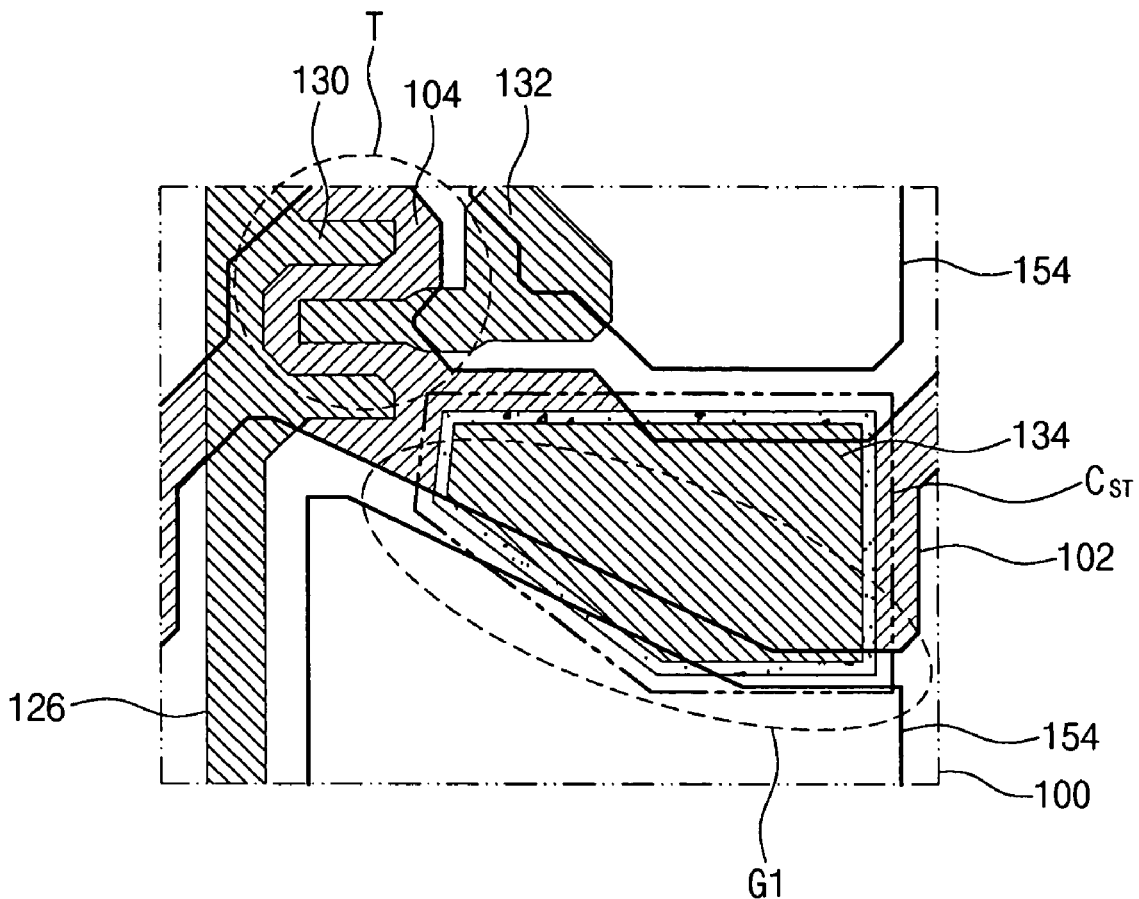
FIG. 17A is a plan view of a storage region when a gate line has curved sides.
Figure 17B:
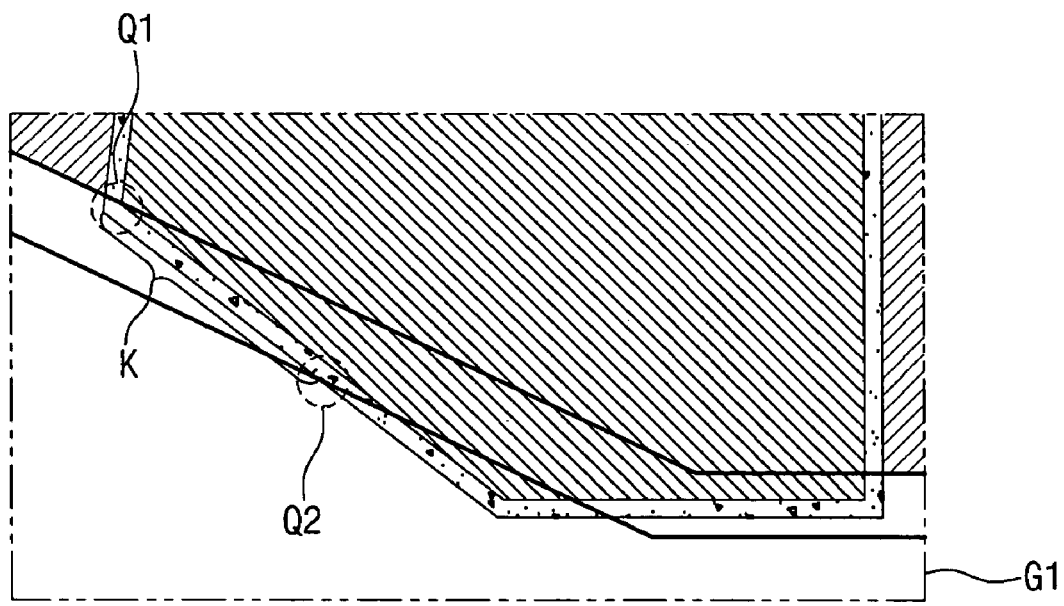
FIG. 17B is an enlarged view of the region G1 of FIG. 17A.

FIG. 17A illustrates a storage region when the gate line has curved sides, and FIG. 17B is an enlarged view of the region G1 of FIG. 17A. In FIGS. 17A and 17B, a gate line 102 is formed along a first direction, and a data line 126 is formed along a second direction crossing the first direction.

A thin film transistor T is formed at the crossing portion of the gate and data lines 102 and 126. The thin film transistor T includes a gate electrode 104, an active layer (not shown), a source electrode 130 and a drain electrode 132. Here, the source electrode 130 has a U shape. The drain electrode 132 is spaced apart from the source electrode 130 and is surrounded by the source electrode 130 to thereby expose the active layer in a U shape between the source and drain electrodes 130 and 132. The exposed active layer becomes a channel of the thin film transistor T. In the structure, a length of the channel is decreased, and a width of the channel is increased, thereby improving characteristics of the thin film transistor T.

A pixel electrode 154 is formed in a pixel region. A metal pattern 134 is formed over the gate line 102 to form a storage capacitor with the gate line 102. The metal pattern 134 contacts a pixel electrode 154.

Here, the gate line 102 has a curved side in the pixel region, and the metal pattern 134 has at least one curved portion in a side contacting the pixel electrode 154. The side of the metal pattern 134 may have a non-symmetric shape according to the curved side of the gate line 102. The pixel electrode 154 overlaps at least one curved portion of the side of the metal pattern 134. The pixel electrode 154 also has at least one curved portion in a side contacting the metal pattern 134. The side of the pixel electrode 154 may be parallel to the curved side of the gate line 102.

Therefore, a distance K between a portion Q1 of the metal pattern 134 overlapping the gate line 102 and a portion Q2 of the metal pattern 134 contacting the pixel electrode 154 is longer as compared to the related art.

Figure 18A:
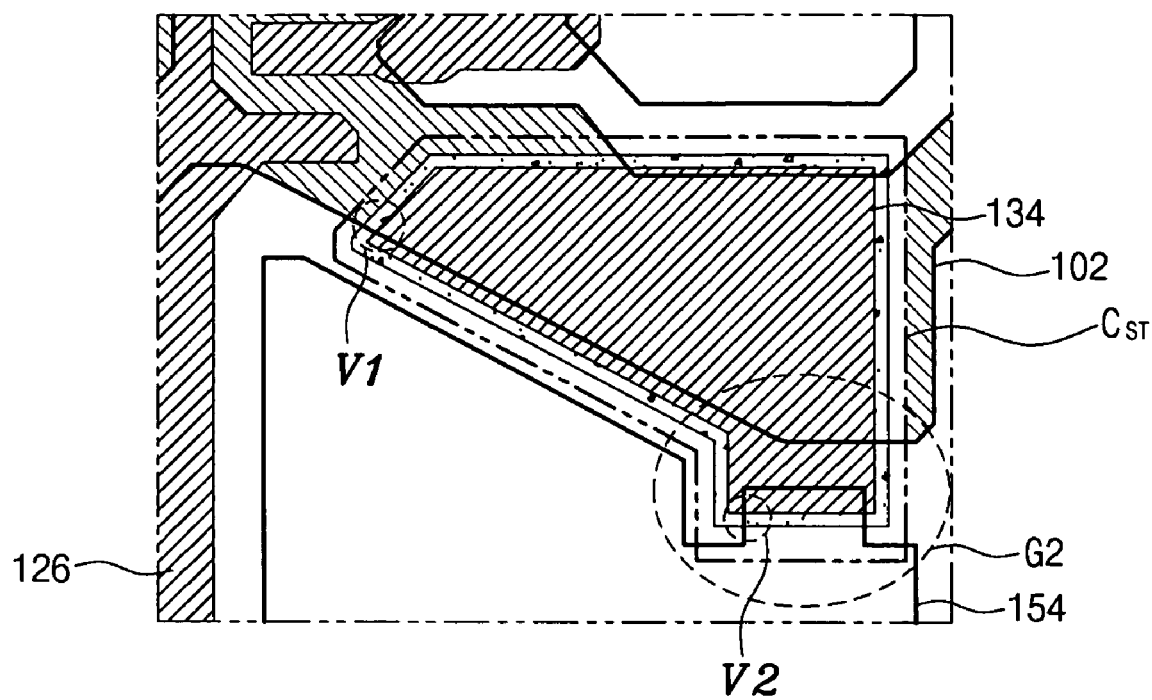
FIG. 18A is a plan view of a storage region of another example when a gate line has curved sides.
Figure 18B:
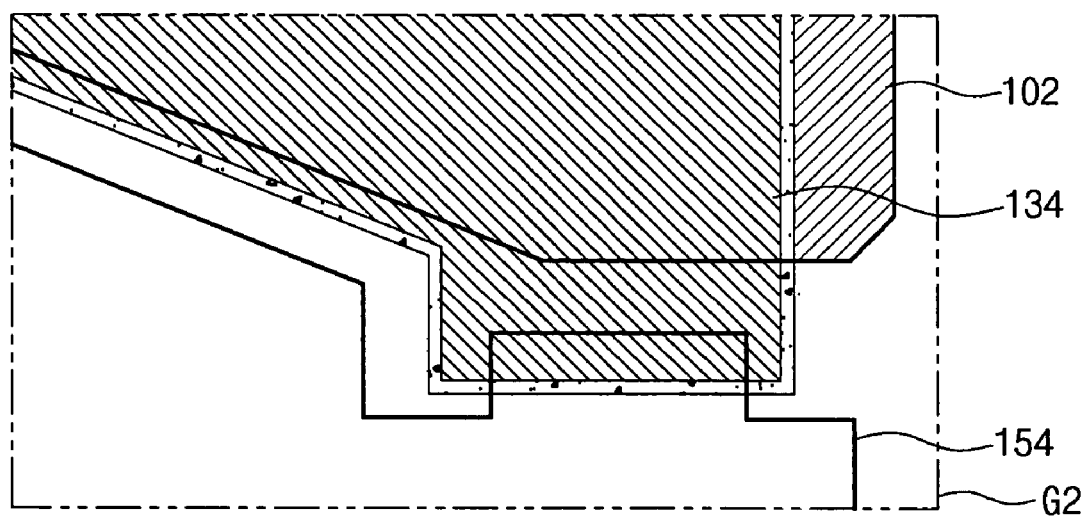
FIG. 18B is an enlarged view of the region G2 of FIG. 18A.

Another example is shown in FIGS. 18A and 18B. FIG. 18A illustrates a storage region of another example when a gate line has curved sides, and FIG. 18B is an enlarged view of the region G2 of FIG. 18A.

In FIGS. 18A and 18B, a gate line 102 has the same shape as that of FIGS. 17A and 17B, and a metal pattern 134 has a projecting part. A pixel electrode 154 contacts the projecting part of the metal pattern 134. Accordingly, a portion V1 of the metal pattern 134 overlapping the gate line 102 is farther from a portion V2 of the metal pattern 134 contacting the pixel electrode 154 in comparison with the case of FIGS. 17A and 17B.

In the present invention, because a distance between the passivation layer (not shown) corresponding to the portion of the metal pattern contacting the pixel electrode and the gate line overlapping the metal line increases along sides of the metal pattern, the gate line is not exposed even if the passivation layer and the gate insulating layer may be over-etched in the region where the pixel electrode and the metal pattern contact each other. Therefore, productivity of the processes may be increased.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device, the method comprising:
   providing first and second substrates;
   forming a gate line and a data line on a substrate, the gate and data lines crossing each other to define a pixel region;
   forming a thin film transistor at a crossing the gate and data lines;
   forming a metal pattern over the gate line;
   forming a passivation layer exposing the substrate in the pixel region, a part of the thin film transistor and a part of the metal pattern;
   forming a pixel electrode in the pixel region, the pixel electrode connected to the part of the thin film transistor and contacting the part of the metal pattern; and
   forming a liquid crystal layer between the first and second substrates,
   wherein the passivation layer exposes a side surface of the metal pattern, the pixel electrode contacts the side surface of the metal pattern, and the metal pattern has at least one curved portion in the side surface contacting the pixel electrode, the at least one curved portion having an angle larger then 90 degrees.

2. The method according to claim 1, further comprising forming a first semiconductor pattern under source and drain electrode of the thin film transistor, a second semiconductor pattern under the data line, and a third semiconductor pattern under the metal pattern.

3. The method according to claim 2, wherein each of the first, second and third semiconductor patterns includes an intrinsic amorphous silicon layer and an impurity-doped amorphous silicon layer.

4. The method according to claim 3, wherein the intrinsic amorphous silicon layer of each of the first, second and third semiconductor patterns is exposed along edges of source and drain electrodes of the thin film transistor and the data line.

5. The method according to claim 1, wherein the gate line has curved sides.

6. The method according to claim 5, wherein a side of the pixel electrode contacting the metal pattern is parallel to one of the curved sides of the gate line.

7. The method according to claim 5, wherein the metal pattern has a projected part that contacts the pixel electrode.

8. The method according to claim 7, wherein a part of the metal pattern except the projected part in the side contacting the pixel electrode is parallel to one of the curved sides of the gate line.

9. The method according to claim 1, wherein the substrate is formed using at most three mask processes.

10. A method of manufacturing a liquid crystal display device, the method comprising:
    forming a gate line and a gate electrode connected to the gate line through a first mask process, a part of the gate line corresponding to a storage region and a part of the gate electrode corresponding to a switching region;
    forming a gate insulating layer on substantially an entire surface of the substrate including the gate line and the gate electrode;
    forming first, second and third semiconductor patterns, source and drain electrodes, a data line, and a metal pattern through a second mask process, the first semiconductor pattern disposed on the gate insulating layer over the gate electrode, the source and drain electrodes disposed on the first semiconductor pattern and spaced apart from each other, the second semiconductor pattern extending from the first semiconductor pattern, the data line disposed on the second semiconductor pattern, the third semiconductor pattern disposed in the storage region, and the metal pattern disposed on the third semiconductor pattern; and
    forming a passivation layer and a pixel electrode through a third mask process, the passivation layer exposing the substrate in the pixel region, a part of the drain electrode and a part of the metal pattern, the pixel electrode in the pixel region and contacting the part of the drain electrode and the part of the metal pattern,
    wherein the passivation layer exposes a side surface of the metal pattern, the pixel electrode contacts the side surface of the metal pattern, and the metal pattern has at least one curved portion in the side surface contacting the pixel electrode, the at least one curved portion having an angle larger than 90 degrees.

11. The method according to claim 10, wherein each of the first, second and third semiconductor patterns includes an intrinsic amorphous silicon layer and an impurity-doped amorphous silicon layer.

12. The method according to claim 11, wherein the intrinsic amorphous silicon layer of each of the first, second and third semiconductor patterns is exposed along edges of the source and drain electrodes and the data line.

13. The method according to claim 10, wherein the second mask process comprises:

forming an intrinsic amorphous silicon layer, an impurity-doped amorphous silicon layer and a metal layer over the gate insulating layer;

forming a photoresist layer on the metal layer;

disposing a mask over the photoresist layer, the mask including a transmitting portion, a blocking portion and a half transmitting portion;

exposing the photoresist layer to light through the mask and then developing the photoresist layer to thereby form a photoresist pattern having different thicknesses;

selectively removing portions of the metal layer, the impurity-doped amorphous silicon layer, and the intrinsic amorphous silicon layer according to the photoresist pattern;

removing a portion of the photoresist pattern having a thinner thickness to expose a part of the metal layer corresponding to the half transmitting portion of the mask;

selectively etching the part of the metal layer exposed by removing the portion of the photoresist pattern;

selectively etching the impurity-doped amorphous silicon layer exposed by selectively etching the part of the metal layer exposed by removing the photoresist pattern having the thinner thickness; and removing the remaining photoresist pattern.

14. The method according to claim 10, wherein the third mask process comprises:

forming a passivation layer on substantially an entire surface of the substrate including the source and drain electrodes, the data line and the metal pattern;

forming a photosensitive organic pattern exposing the pixel region by coating a photosensitive organic layer and then patterning the photosensitive organic layer through the third mask process;

removing the passivation layer and the gate insulating layer corresponding to the pixel region using the photosensitive organic pattern as an etching mask to expose the part of the drain electrode and the part of the metal pattern;

forming a transparent conductive layer on a substantially entire surface of the substrate including the passivation layer and the gate insulating layer removed in the pixel region; and removing the photosensitive organic pattern and the transparent conductive layer on the photosensitive organic pattern to complete the pixel electrode.

15. The method according to claim 14, wherein forming the photosensitive organic pattern in the third mask process comprises curing the photosensitive organic pattern such that sides of the photosensitive organic pattern are inversely tapered with respect to the surface of the substrate.

16. The method according to claim 15, wherein forming the photosensitive organic pattern in the third mask process further comprises curing the photosensitive organic pattern such that a surface of the photosensitive organic pattern has a circular arc shaped cross-section.

17. The method according to claim 10, wherein the substrate is formed using at most three mask processes.

18. The method according to claim 10, wherein a length of the side of the metal pattern between a portion of the metal pattern overlapping the gate line and a portion of the metal pattern contacting the pixel electrode is longer than a minimum distance between the gate line and the pixel electrode.

* * * * *